(12) United States Patent
Nishimura et al.

(10) Patent No.: US 12,382,634 B2
(45) Date of Patent: Aug. 5, 2025

(54) SEMICONDUCTOR MEMORY DEVICE THAT INCLUDES A PLURALITY OF FIRST PILLARS, SECOND PILLARS, AND THIRD PILLARS

(71) Applicant: Kioxia Corporation, Tokyo (JP)

(72) Inventors: Takahito Nishimura, Kuwana (JP); Takuya Nishikawa, Yokkaichi (JP)

(73) Assignee: Kioxia Corporation, Tokyo (JP)

(*) Notice: Subject to any disclaimer, the term of this patent is extended or adjusted under 35 U.S.C. 154(b) by 501 days.

(21) Appl. No.: 17/840,686

(22) Filed: Jun. 15, 2022

(65) Prior Publication Data

US 2023/0200071 A1    Jun. 22, 2023

(30) Foreign Application Priority Data

Dec. 17, 2021 (JP) .................................. 2021-204989

(51) Int. Cl.
*H10B 43/27* (2023.01)
*H10B 41/42* (2023.01)

(52) U.S. Cl.
CPC ............. *H10B 43/27* (2023.02); *H10B 41/42* (2023.02)

(58) Field of Classification Search
CPC ........ H10B 43/27; H10B 41/42; H10B 43/50; H10B 43/10
See application file for complete search history.

(56) References Cited

U.S. PATENT DOCUMENTS

| 2015/0069568 | A1* | 3/2015 | Yamane | H10B 43/50 |
| | | | | 257/499 |
| 2020/0251484 | A1 | 8/2020 | Ito et al. | |
| 2020/0279859 | A1* | 9/2020 | Uchida | H10B 43/27 |
| 2021/0066338 | A1 | 3/2021 | Otaguro et al. | |
| 2021/0288060 | A1* | 9/2021 | Hachisuga | H10B 43/40 |
| 2022/0399360 | A1* | 12/2022 | Son | H10B 41/40 |
| 2023/0036595 | A1* | 2/2023 | Thimmegowda | H10B 41/10 |

FOREIGN PATENT DOCUMENTS

| JP | 2020-126938 A | 8/2020 | |
| JP | 2021-034651 A | 3/2021 | |
| WO | WO-2021155611 A1 * | 8/2021 | ......... G11C 16/0466 |

* cited by examiner

*Primary Examiner* — Mamadou L Diallo
(74) *Attorney, Agent, or Firm* — Oblon, McClelland, Maier & Neustadt, L.L.P.

(57) ABSTRACT

According to one embodiment, a semiconductor memory device includes: a first stacked body that includes a memory region, a stepped region, and a connection region arranged in a first direction; a plurality of first pillars that is disposed in the memory region, extends in the first stacked body in the stacking direction; a plurality of second pillars that includes a second insulating layer, has a layer structure different from a layer structure of the first pillars, and extends in the stacking direction in a position overlapping a stepped portion disposed in the stepped region in the stacking direction; and a plurality of third pillars that extends in the first stacked body in the stacking direction, and has a same layer structure as the layer structure of the first pillars, at least a part of the plurality of third pillars being disposed in the connection region.

20 Claims, 25 Drawing Sheets

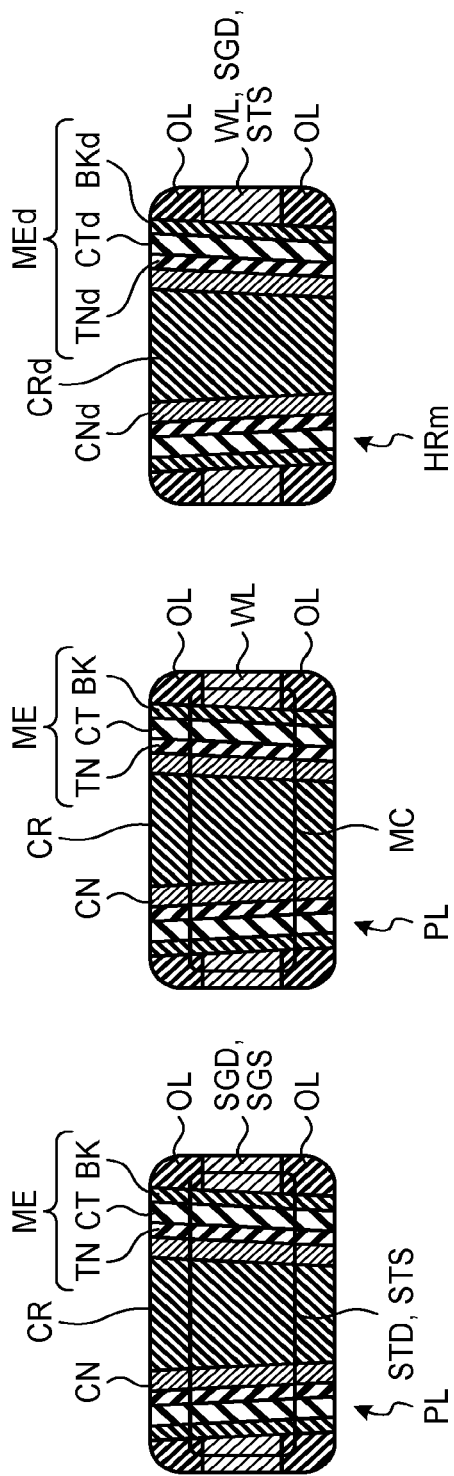

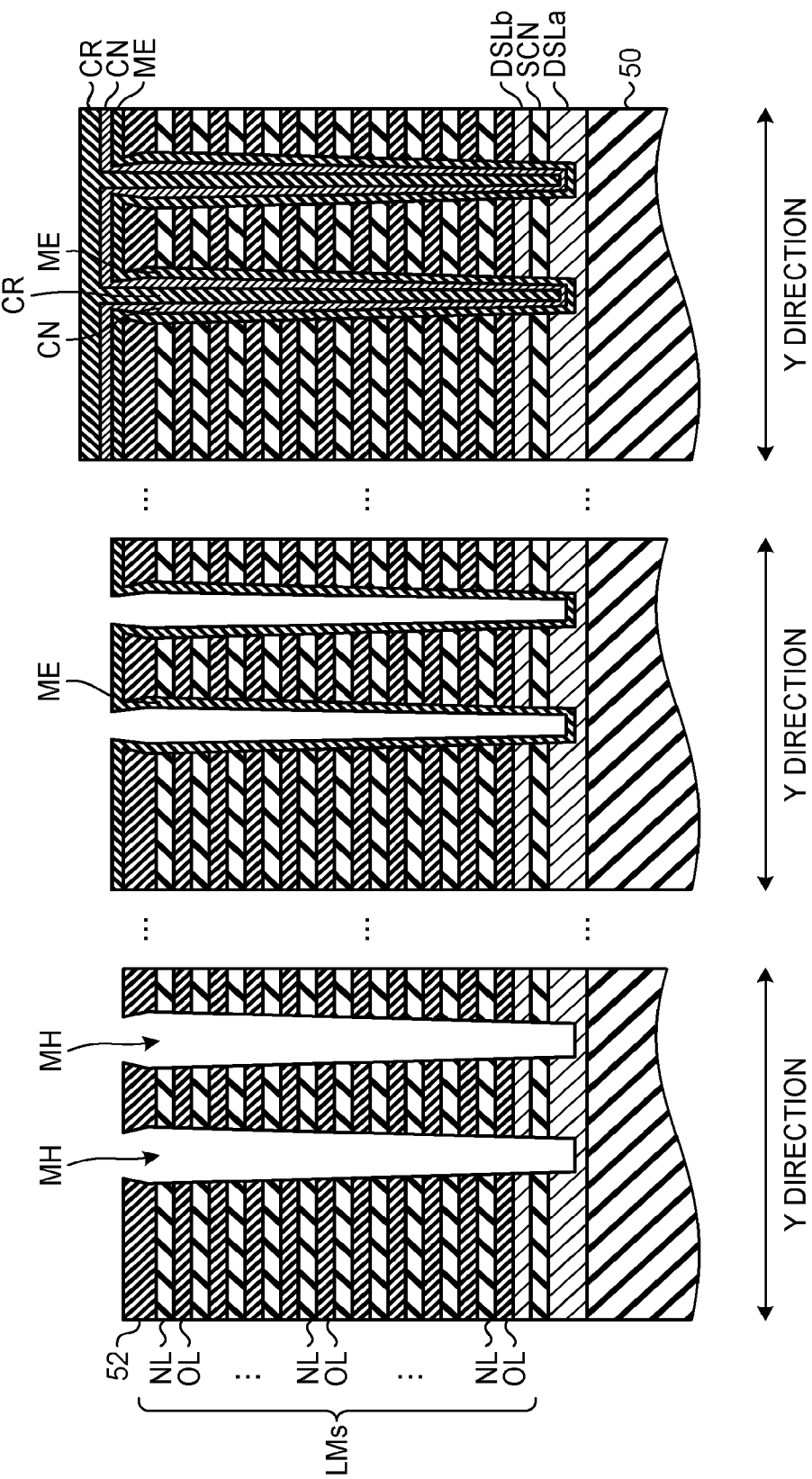

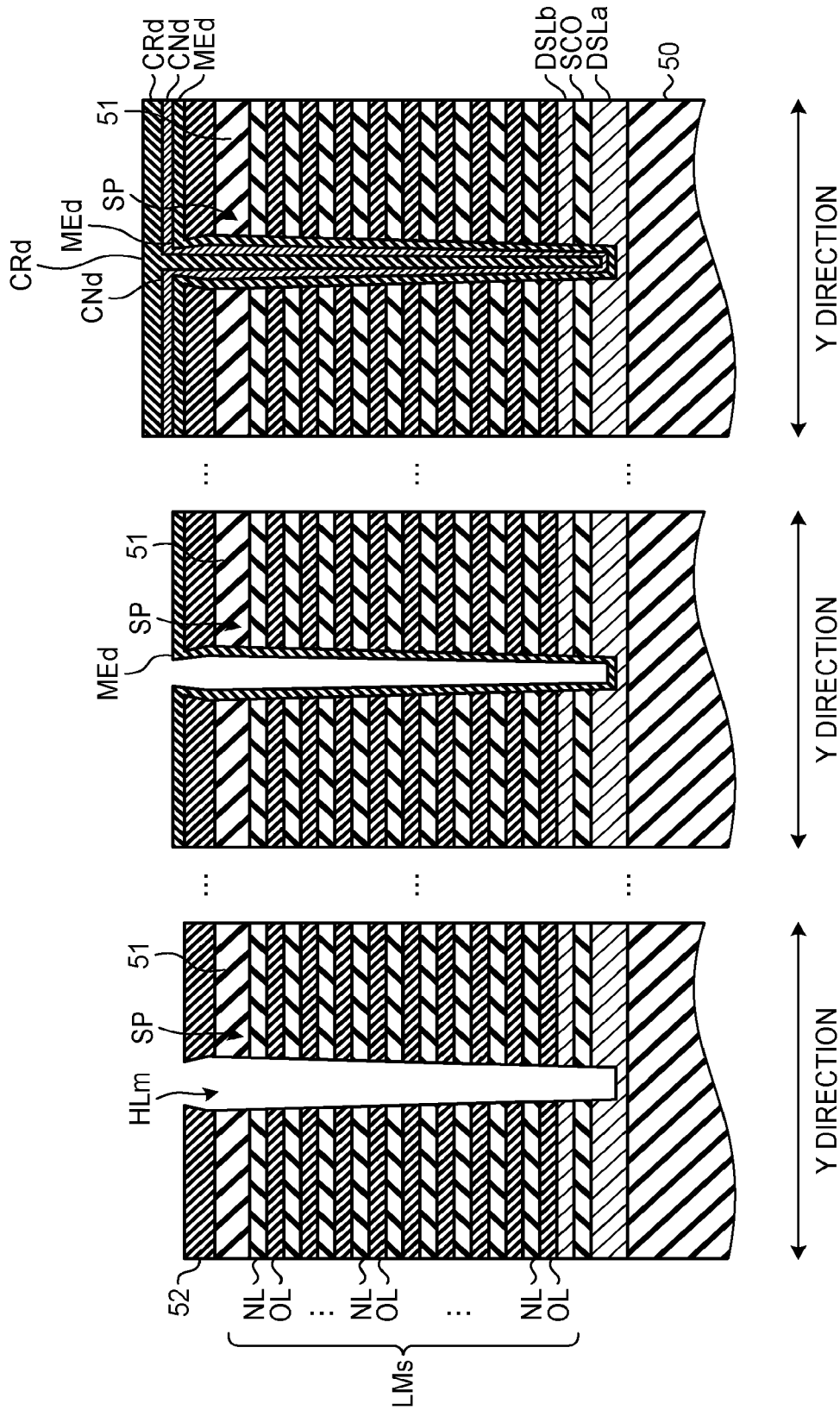

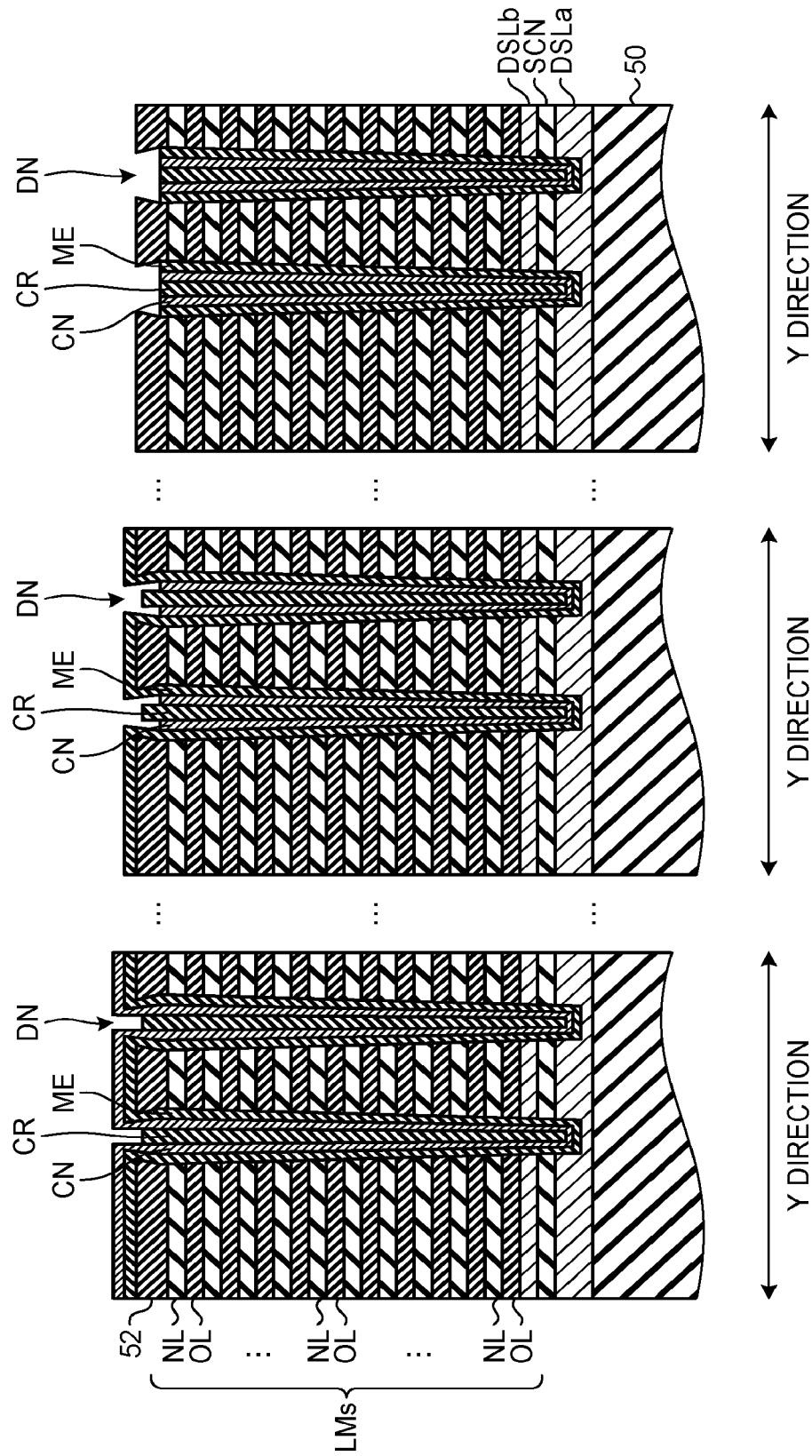

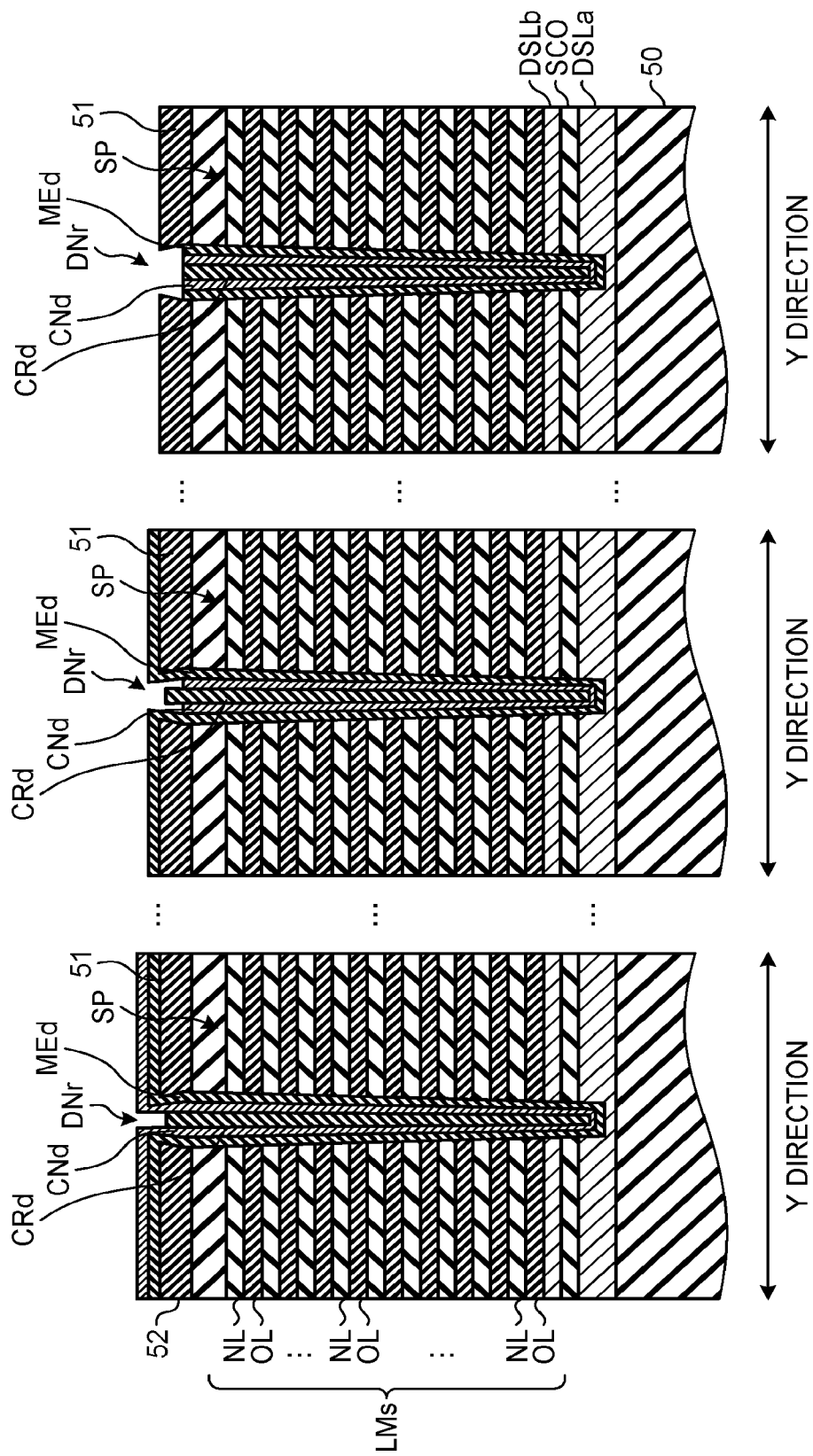

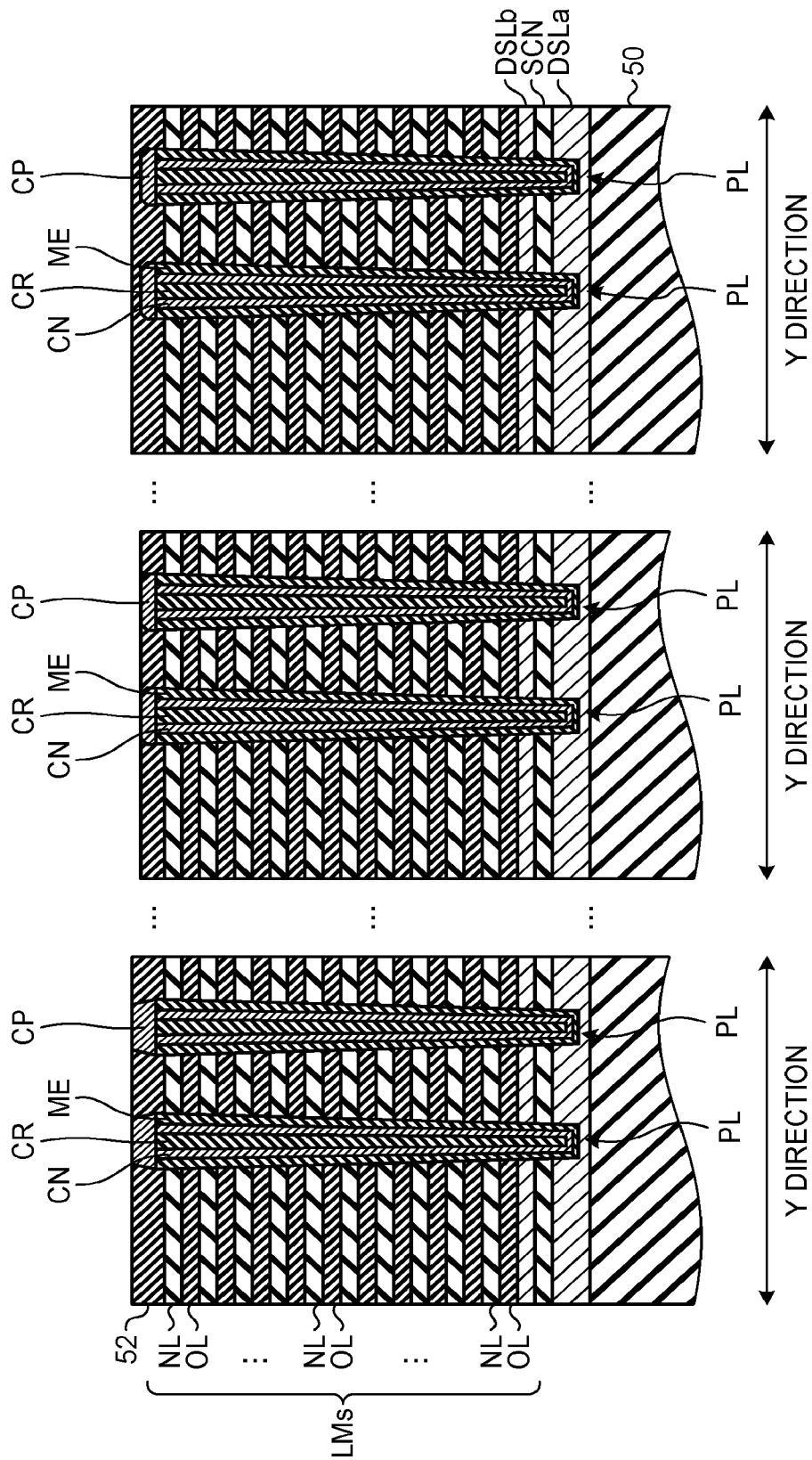

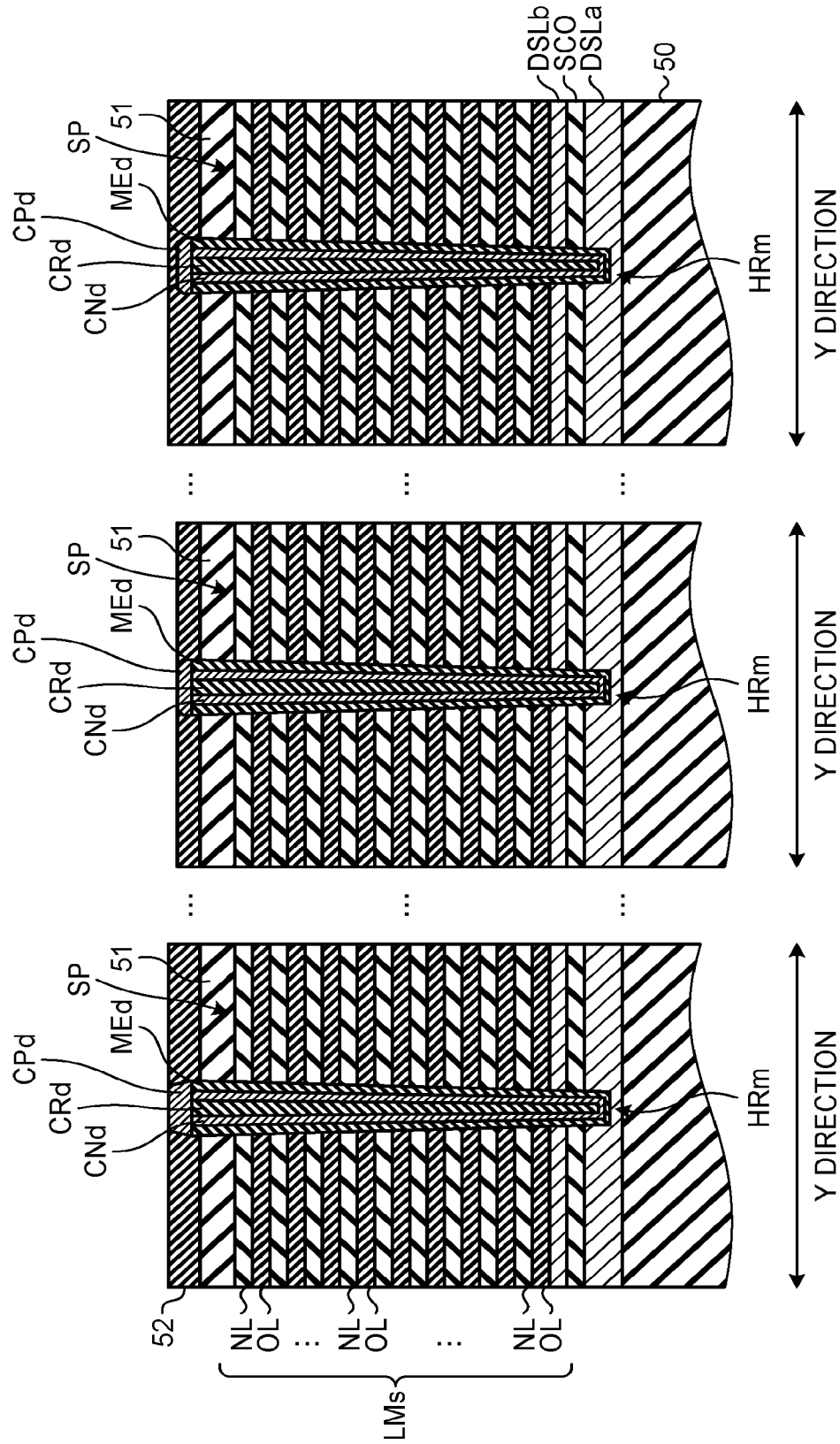

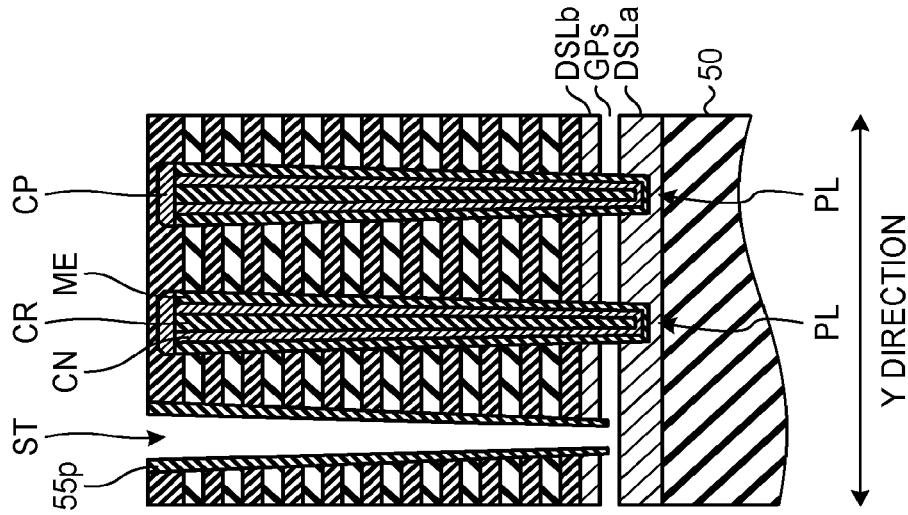
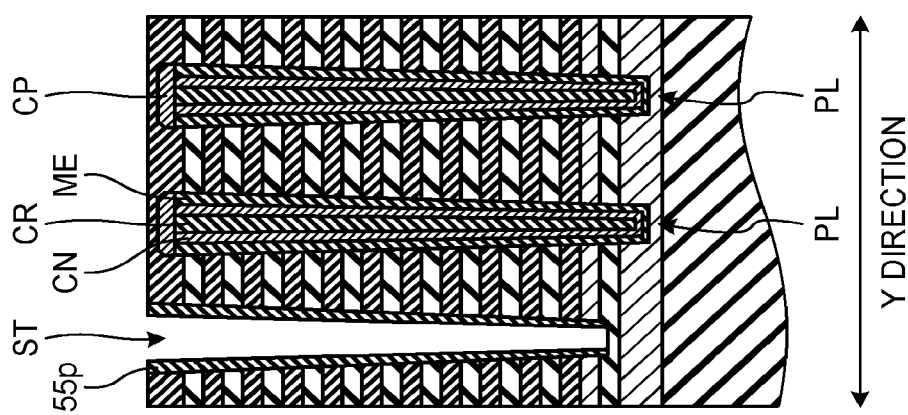
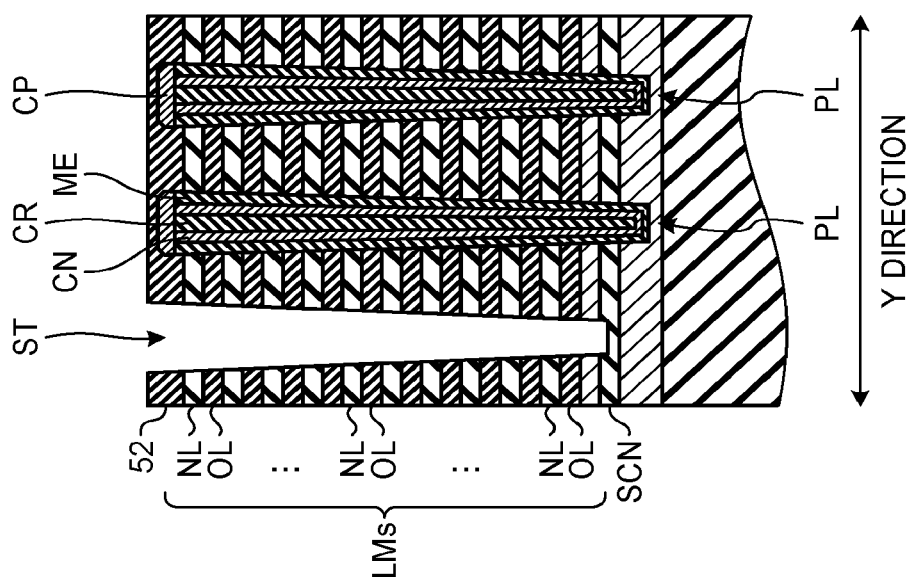

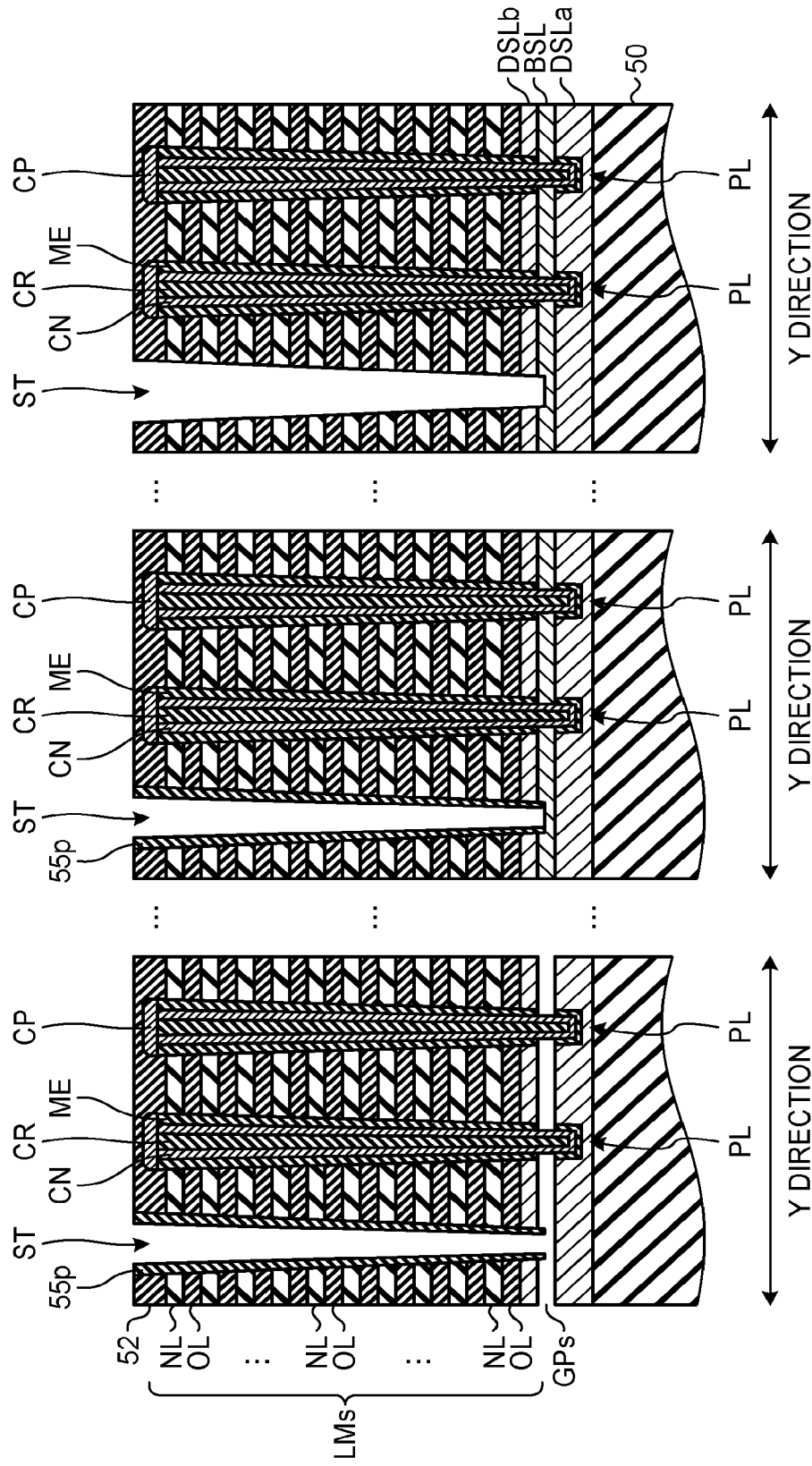

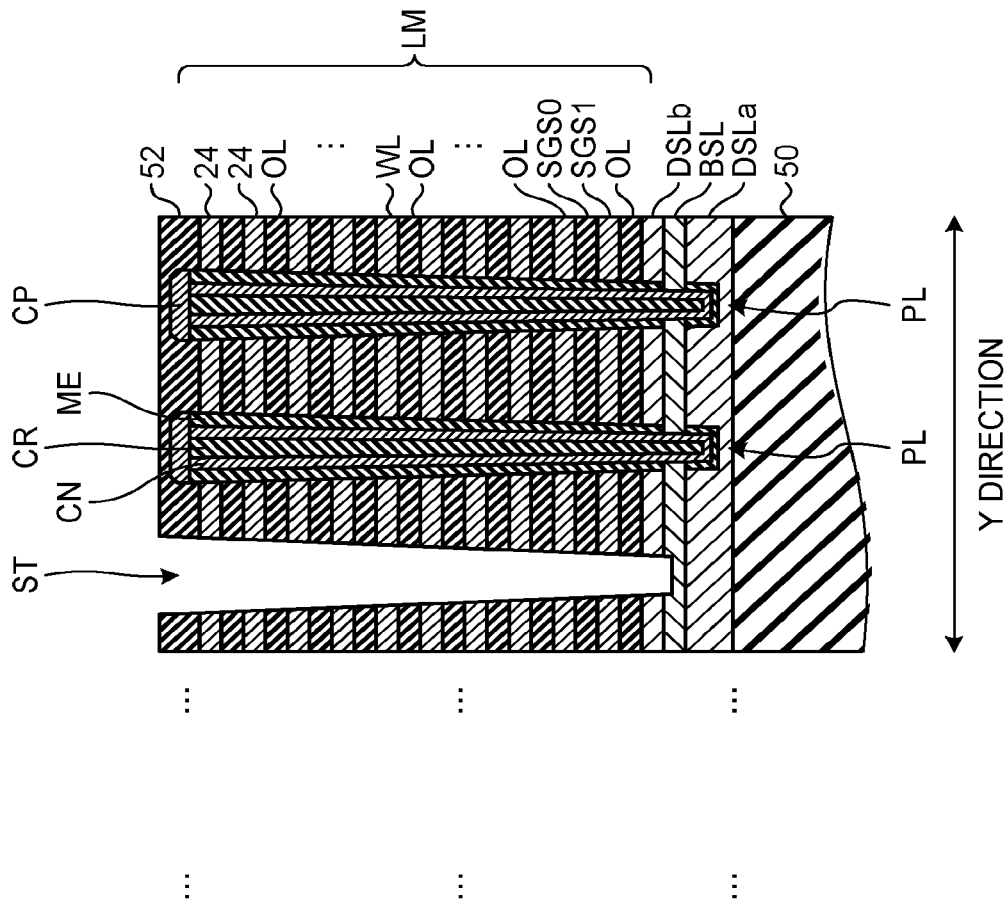
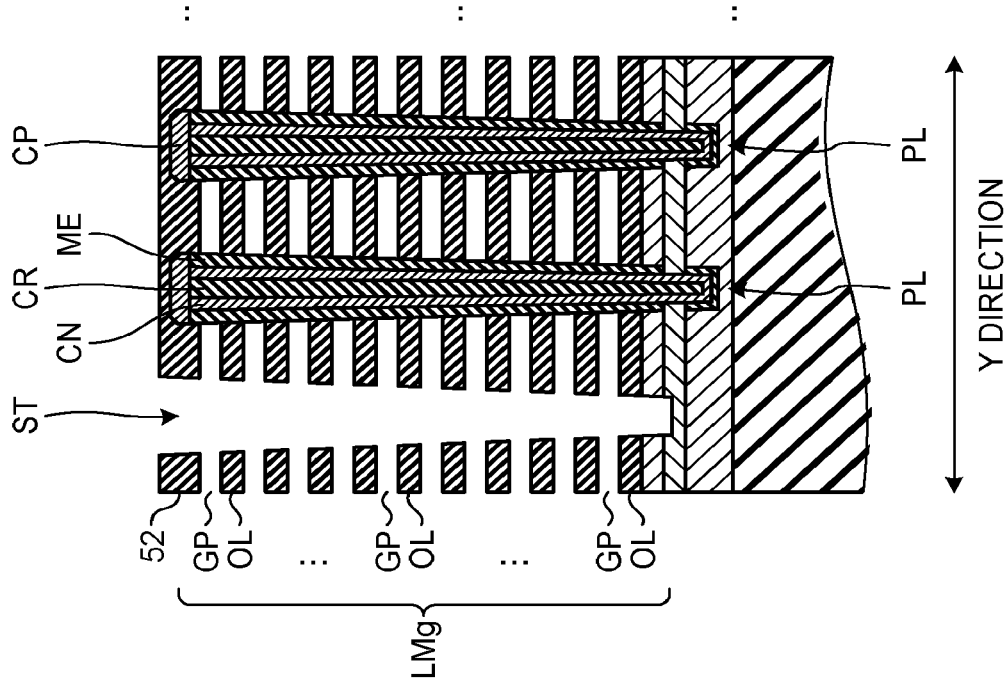
FIG.12Ab
FIG.12Aa

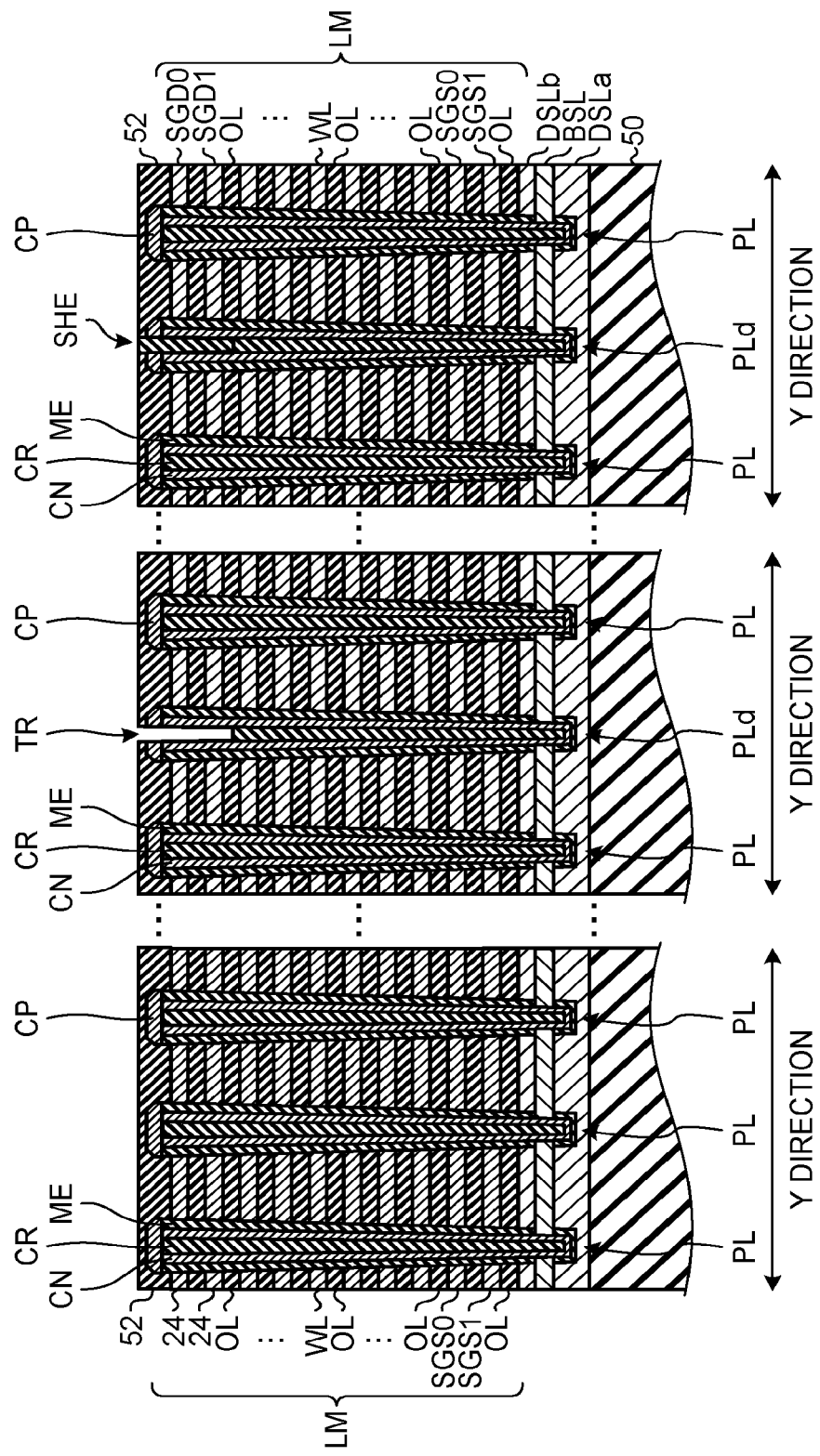

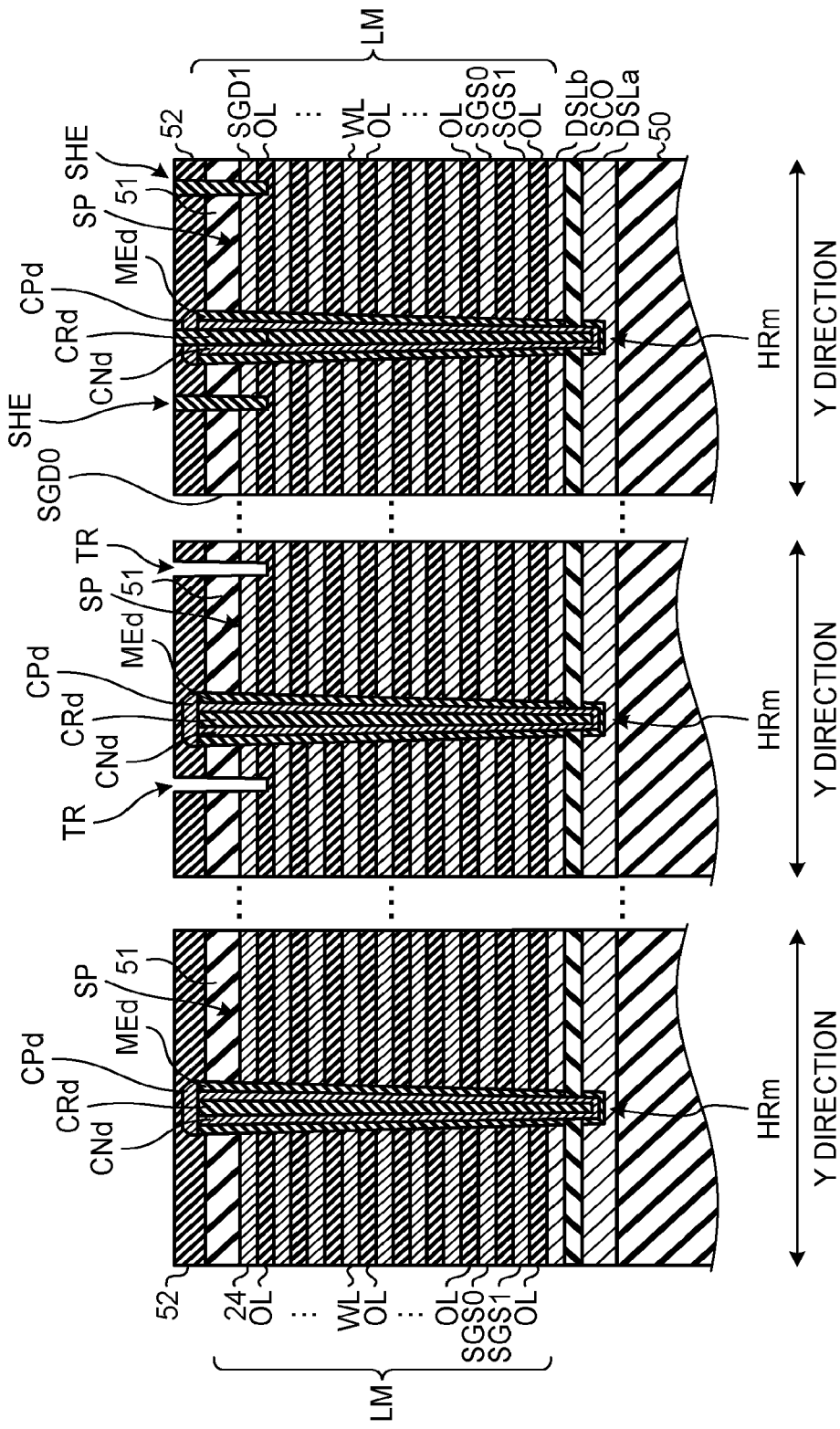

SEMICONDUCTOR MEMORY DEVICE THAT INCLUDES A PLURALITY OF FIRST PILLARS, SECOND PILLARS, AND THIRD PILLARS

CROSS-REFERENCE TO RELATED APPLICATIONS

This application is based upon and claims the benefit of priority from Japanese Patent Application No. 2021-204989, filed on Dec. 17, 2021; the entire contents of which are incorporated herein by reference.

FIELD

Embodiments described herein relate generally to a semiconductor memory device.

BACKGROUND

In a semiconductor memory device such as a three-dimensional nonvolatile memory, memory cells are three-dimensionally arranged in a stacked body in which a plurality of conductive layers and a plurality of insulating layers are alternately stacked. However, the stacked body partially sinks in a stacking direction, as a result of which the stacked body may have an uneven upper surface.

BRIEF DESCRIPTION OF THE DRAWINGS

FIGS. 2A to 2E are cross-sectional views illustrating an example of a configuration of the semiconductor memory device according to the embodiment;

FIGS. 7Aa to 7Bc are views sequentially illustrating a part of the procedure of the method for manufacturing the semiconductor memory device according to the embodiment;

FIGS. 8Aa to 8Bc are views sequentially illustrating a part of the procedure of the method for manufacturing the semiconductor memory device according to the embodiment;

FIGS. 9Aa to 9Bc are views sequentially illustrating a part of the procedure of the method for manufacturing the semiconductor memory device according to the embodiment;

FIGS. 10A to 10C are views sequentially illustrating a part of the procedure of the method for manufacturing the semiconductor memory device according to the embodiment;

FIGS. 11A to 11C are views sequentially illustrating a part of the procedure of the method for manufacturing the semiconductor memory device according to the embodiment;

FIGS. 13Aa to 13Bc are views sequentially illustrating a part of the procedure of the method for manufacturing the semiconductor memory device according to the embodiment;

DETAILED DESCRIPTION

In general, according to one embodiment, a semiconductor memory device includes: a first stacked body that includes a plurality of conductive layers and a plurality of first insulating layers alternately stacked one by one and includes a memory region, a stepped region, and a connection region arranged in a first direction intersecting a stacking direction of the plurality of conductive layers; a contact portion that is disposed in the connection region and electrically connects structures disposed above and below the first stacked body to each other; a plurality of first pillars that is disposed in the memory region, extends in the first stacked body in the stacking direction, and forms a memory cell at each intersection with at least a part of the plurality of conductive layers; a plurality of second pillars that includes a second insulating layer, has a layer structure different from a layer structure of the first pillars, and extends in the stacking direction in a position overlapping a stepped portion disposed in the stepped region, in the stacking direction, the plurality of conductive layers being processed in a stepped shape in the stepped portion; and a plurality of third pillars that extends in the first stacked body in the stacking direction, and has a same layer structure as the layer structure of the first pillars, at least a part of the plurality of third pillars being disposed in the connection region.

Exemplary embodiments of the semiconductor memory device will be explained below in detail with reference to the accompanying drawings. The present invention is not limited to the following embodiments. In addition, components in the following embodiments include those that can be easily assumed by those skilled in the art or those that are substantially the same.

(Configuration Example of Semiconductor Memory Device)

Figure 1A:
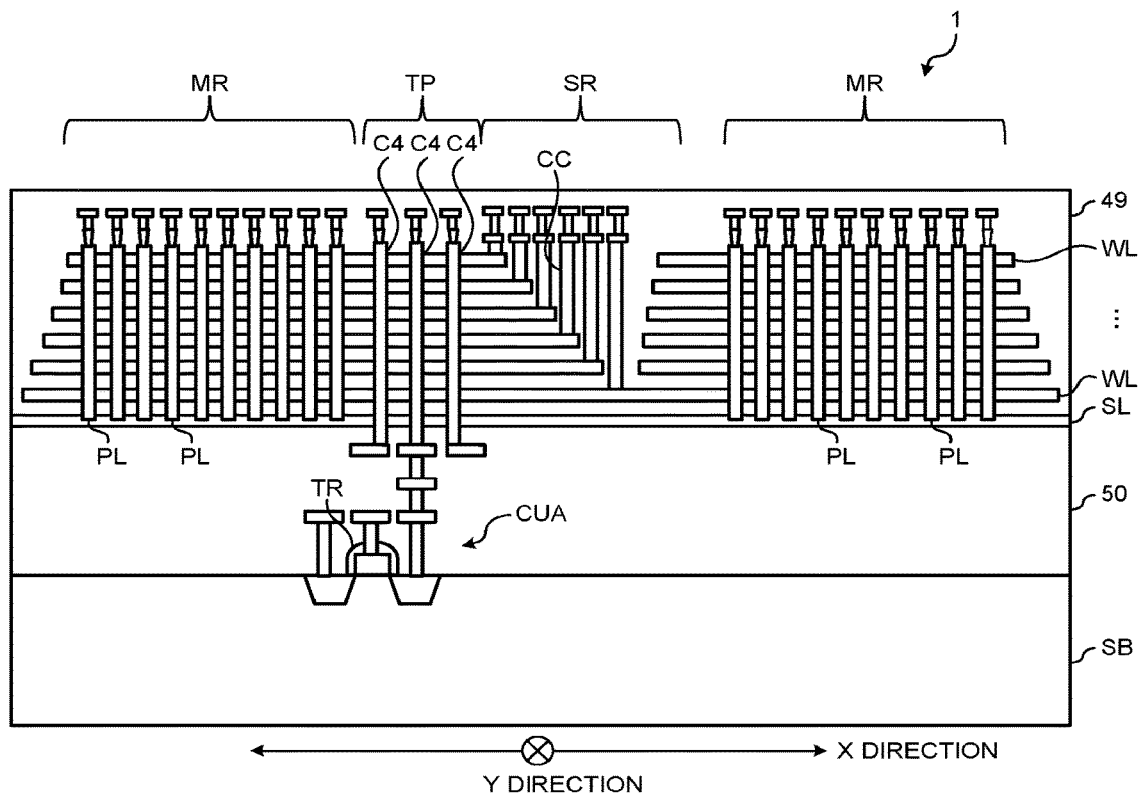
FIGS. 1A and 1B are views illustrating a schematic configuration example of a semiconductor memory device according to an embodiment.
Figure 1B:
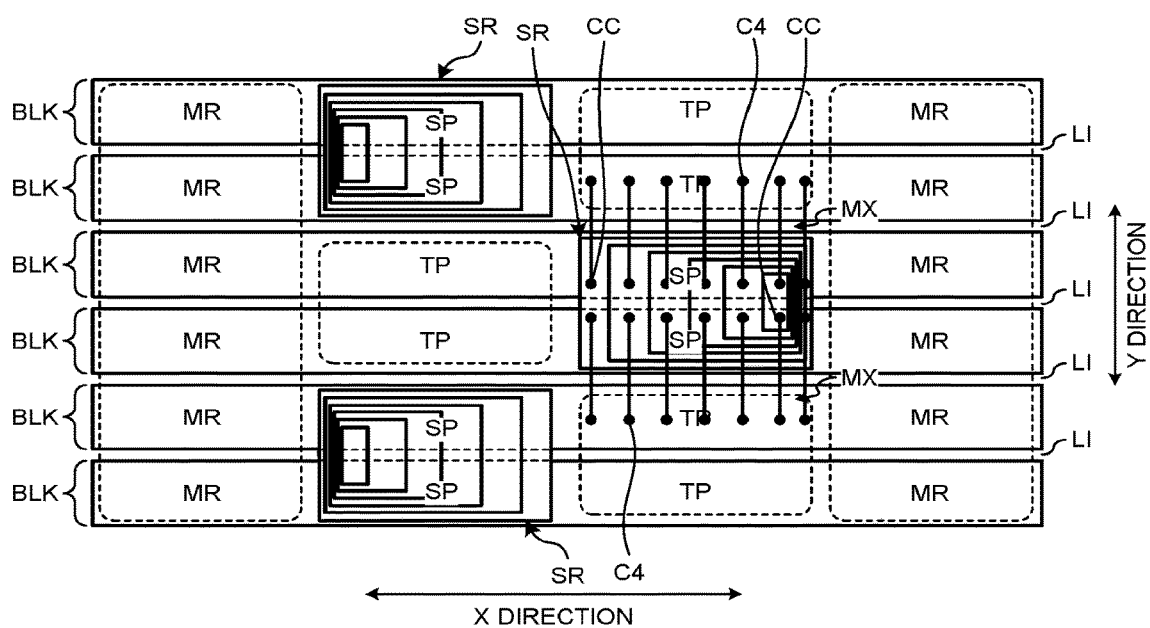

FIGS. 1A and 1B are views illustrating a schematic configuration example of a semiconductor memory device 1 according to an embodiment. FIG. 1A is a cross-sectional view, of the semiconductor memory device 1, in an X direction, and FIG. 1B is a schematic plan view illustrating a layout of the semiconductor memory device 1. However, in FIG. 1A, hatching is omitted in consideration of visibility of the drawing. In FIG. 1A, some select gate lines and upper layer wirings are omitted.

In the present specification, both the X direction and a Y direction are directions along a surface of a word line WL to be described later, and the X direction and the Y direction are orthogonal to each other. Further, an electrical drawing direction of the word line WL to be described later may be referred to as a first direction, and the first direction is a direction along the X direction. A direction intersecting the first direction may be referred to as a second direction, and the second direction is a direction along the Y direction. However, since the semiconductor memory device 1 may have a manufacturing variation, the first direction and the second direction are not necessarily orthogonal to each other.

As illustrated in FIGS. 1A and 1B, the semiconductor memory device 1 includes a peripheral circuit CUA, a memory region MR, a through contact region TP, and a stepped region SR on a substrate SB.

The substrate SB is, for example, a semiconductor substrate such as a silicon substrate. The peripheral circuit CUA including a transistor TR, a wiring, and the like is disposed on the substrate SB. The peripheral circuit CUA contributes to an operation of a memory cell described later.

The peripheral circuit CUA is covered with an insulating layer 50. A source line SL is disposed on the insulating layer 50. A plurality of word lines WL is stacked on the source line SL. The plurality of word lines WL is covered with an insulating layer 49. The insulating layer 49 also extends in the peripheral of the plurality of word lines WL.

A plurality of plate contacts LI penetrating through the word lines WL in the stacking direction and extending along the X direction are arranged in the plurality of word lines WL. In this manner, the plurality of word lines WL is divided in the Y direction by the plurality of plate contacts LI, and the memory region MR, the stepped region SR, and the through contact region TP arranged in the X direction are divided in the Y direction. A region sandwiched between the plate contacts LI adjacent in the Y direction and including the memory region MR, the stepped region SR, and the through contact region TP may be referred to as a block region BLK.

The memory region MR is disposed on each of opposite sides of the plurality of word lines WL in the X direction, and extends across the plurality of plate contacts LI in the Y direction. That is, the memory region MR is disposed over the plurality of block regions BLK.

Each of a plurality of stepped regions SR is disposed to sandwich one plate contact LI from the both sides in the Y direction at a position between the memory regions MR disposed on the opposite sides in the X direction. Each of a plurality of through contact regions TP is disposed to sandwich one plate contact LI from the both side in the Y direction at a position between the memory regions MR disposed on the opposite sides in the X direction.

In other words, one stepped region SR and one through contact region TP are arranged side by side in the X direction across two block regions BLK adjacent to one plate contact LI on the opposite sides in the Y direction. In addition, on the outer side of these two block regions BLK in the Y direction, another through contact region TP is disposed at a position aligned with the above-described stepped region SR in the Y direction, and another stepped region SR is disposed at a position aligned with the above-described through contact region TP in the Y direction.

As described above, in one block region BLK, the memory region MR, the stepped region SR, the through contact region TP, and the memory region MR are arranged in this order from one side in the X direction. In addition, in a block region BLK adjacent to the block region BLK in the Y direction, the memory region MR, the through contact region TP, the stepped region SR, and the memory region MR are arranged in this order from the same side in the X direction.

In the memory region MR, a plurality of pillars PL penetrating through the word lines WL in the stacking direction is disposed. A plurality of memory cells is formed at intersections between the pillars PL and the word lines WL. As a result, the semiconductor memory device 1 is configured as, for example, a three-dimensional nonvolatile memory in which memory cells are three-dimensionally arranged in the memory region MR.

The stepped region SR includes a plurality of stepped portions SP in which the plurality of word lines WL is dug down in a mortar shape in the stacking direction. For example, two stepped portions SP arranged in the Y direction while having one plate contact LI interposed therebetween are disposed in one stepped region SR.

The stepped portion SP forms one side of a mortar shape descending stepwise from the opposite sides in the X direction and one side in the Y direction toward a bottom surface. However, the other side of the stepped portion SP in the Y direction is opened toward a side surface of the plate contact LI.

Each step of the stepped portion SP is configured by the word line WL of each layer. The word line WL of each layer maintains electrical conduction on the opposite sides having the stepped region SR interposed therebetween in the X direction via a stepped part on one side of the stepped portion SP in the Y direction. A contact CC connecting the word line WL of each layer and an upper layer wiring MX is disposed in a terrace portion of each step of the stepped portion SP.

As a result, the word lines WL stacked in multiple layers can be individually drawn. A write voltage, a read voltage, and the like are applied from these contacts CC to the memory cells in the memory regions MR on the opposite sides in the X direction via the word lines WL at the same height positions as those of the memory cells.

In the present specification, a direction in which a terrace surface of each step of the stepped portion SP faces is defined as a top direction.

A through contact C4 penetrating through the plurality of word lines WL is disposed in the through contact region TP serving as a connection region. The through contact C4 connects the peripheral circuit CUA disposed on the lower substrate SB and the upper layer wiring MX connected to the contact CC of the stepped portion SP. Various voltages applied from the contact CC to the memory cell are controlled by the peripheral circuit CUA via the through contact C4, the upper layer wiring MX, and the like.

Next, a detailed configuration example of the semiconductor memory device 1 will be described with reference to FIGS. 2A to 2E. FIGS. 2A to 2E are cross-sectional views illustrating an example of a configuration of the semiconductor memory device 1 according to the embodiment.

Figure 2A:
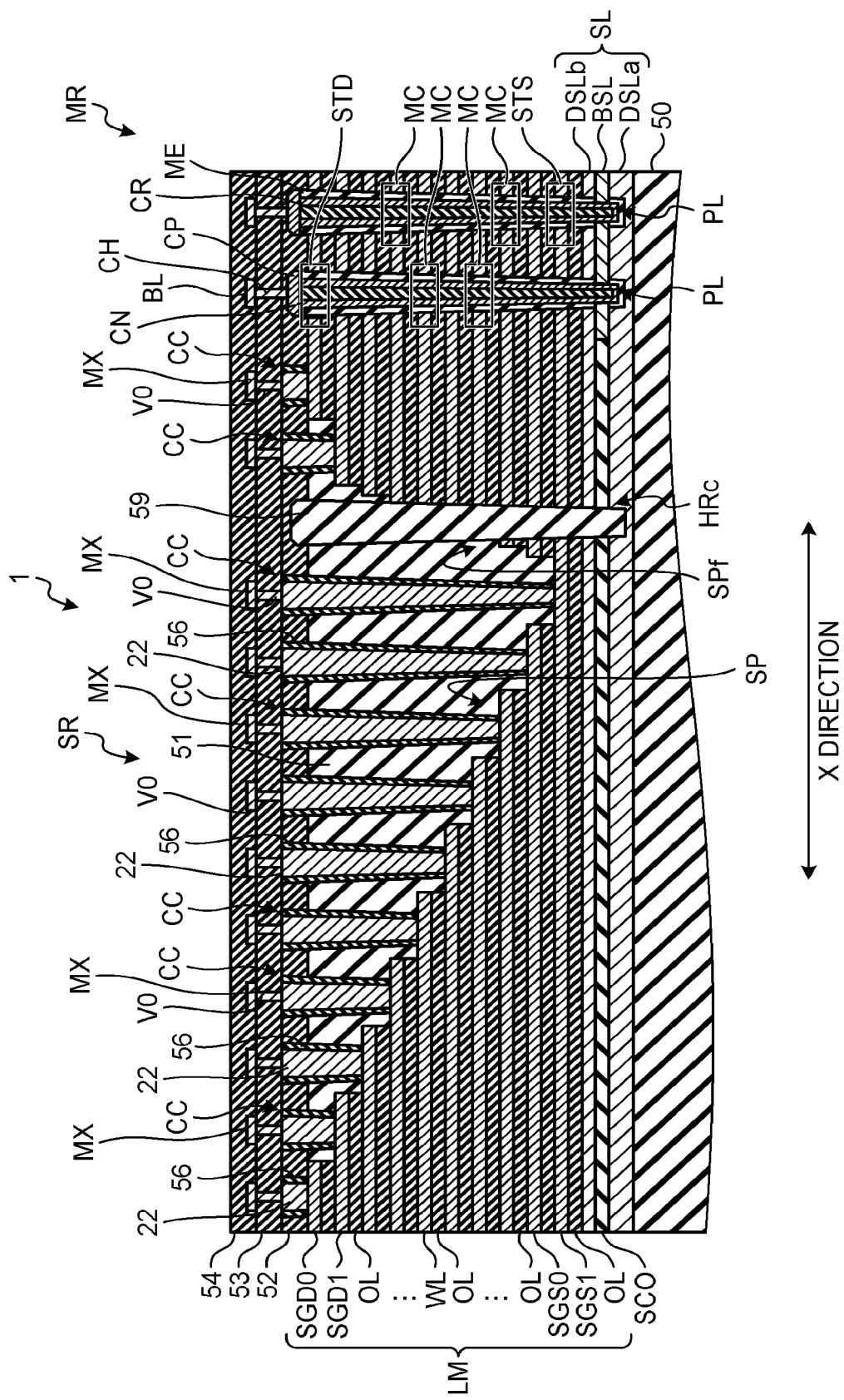
Figure 2B:
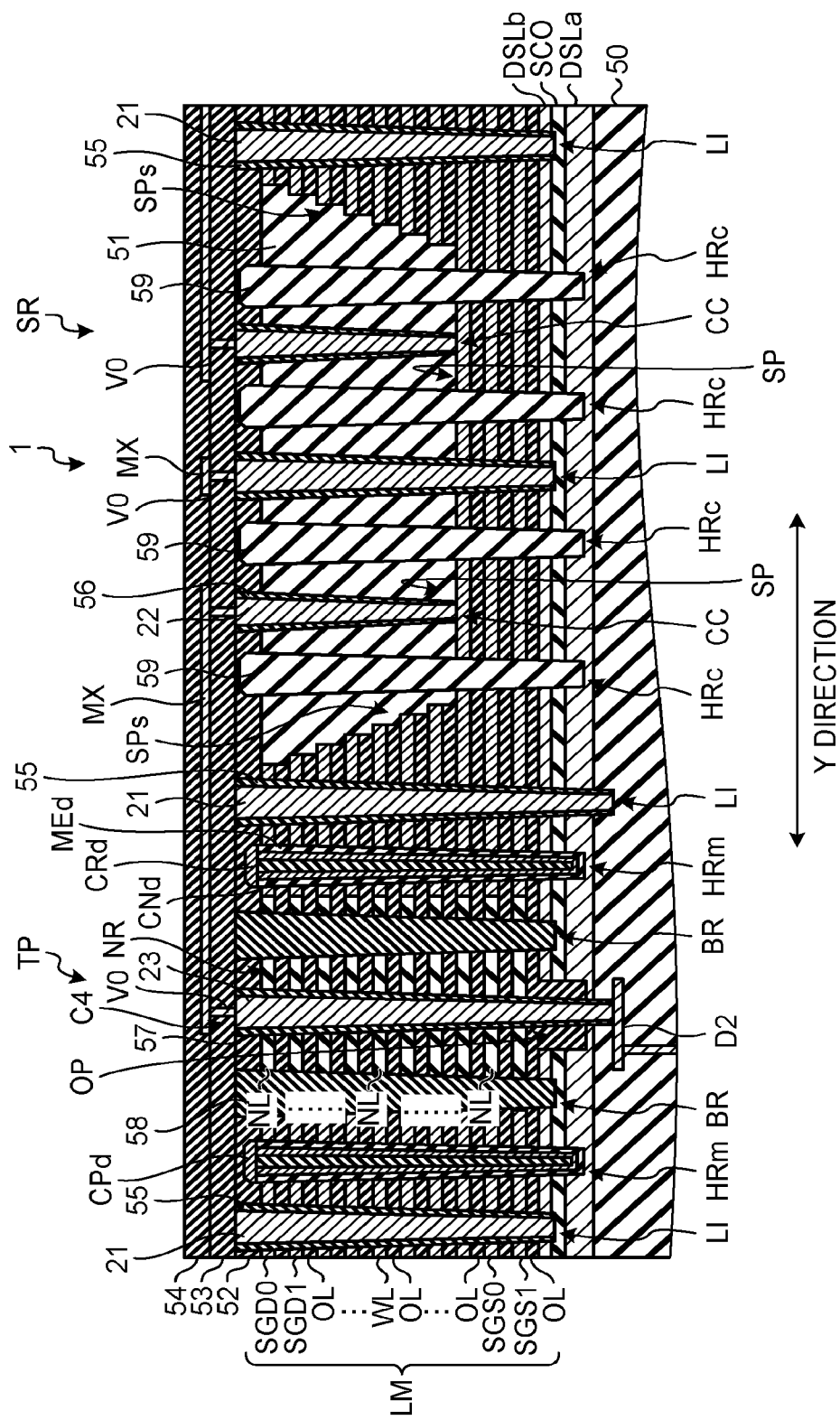

FIG. 2A is a cross-sectional view, including the memory region MR and the stepped region SR, in the X direction. FIG. 2B is a cross-sectional view, including the stepped region SR and the through contact region TP, in the Y direction. However, in FIGS. 2A and 2B, the structures below the insulating layer 50 such as the substrate SB and the peripheral circuit CUA are omitted.

FIGS. 2C and 2D are partially enlarged views illustrating a cross section of the pillar PL disposed in the memory region MR. FIG. 2E is a partially enlarged view illustrating a cross section of a columnar portion HRm disposed in the through contact region TP.

As illustrated in FIGS. 2A and 2B, the source line SL has a multilayer structure in which, for example, a lower source line DSLa, an intermediate source line BSL or intermediate insulating layer SCO, and an upper source line DSLb are stacked in this order on the insulating layer 50.

The lower source line DSLa, the intermediate source line BSL, and the upper source line DSLb are, for example, polysilicon layers. Among them, at least the intermediate source line BSL may be a conductive polysilicon layer or the like in which impurities are diffused. The intermediate source line BSL is disposed below the memory region MR of the stacked body LM.

The intermediate insulating layer SCO is, for example, a silicon oxide layer or the like. The intermediate insulating layer SCO is disposed below the stepped region SR, the through contact region TP, and the like of the stacked body LM excluding the memory region MR.

The stacked body LM is disposed above the source line SL. In the stacked body LM, the plurality of word lines WL and a plurality of insulating layers OL are alternately stacked one by one. Select gate lines SGD0 and SGD1 are arranged in this order from an upper layer side of the stacked body LM while having the insulating layer OL interposed therebetween above the uppermost word line WL. Select gate lines SGS0 and SGS1 are arranged in this order from the lower layer side of the stacked body LM while having the insulating layer OL interposed therebetween below the lowermost word line WL. The number of the word lines WL and the select gate lines SGD and SGS stacked in the stacked body LM is arbitrary.

The plurality of word lines WL and select gate lines SGD and SGS serving as a plurality of conductive layers are, for example, tungsten layers or molybdenum layers. The plurality of insulating layers OL serving as a plurality of first insulating layers are, for example, silicon oxide layers.

The upper surface of the stacked body LM is covered with an insulating layer 52. The insulating layer 52 is covered with an insulating layer 53. The insulating layer 53 is covered with an insulating layer 54. The insulating layers 52 to 54 constitutes a part of the insulating layer 49 of FIG. 1A together with an insulating layer 51 described later.

As illustrated in FIG. 2B, the stacked body LM is divided in the Y direction by the plurality of plate contacts LI.

The plate contacts LI serving as plate members are arranged in the Y direction and extend in the stacking direction of the stacked body LM along the X direction. That is, the plate contact LI penetrates through the insulating layer 52, the stacked body LM, and the upper source line DSLb, reaches the intermediate insulating layer SCO in the stepped region SR, the through contact region TP, and the like, and reaches the intermediate source line BSL in the memory region MR. The plate contact LI continuously extends in the stacked body LM from one end portion to the other end portion of the stacked body LM in the X direction.

In addition, the plate contact LI has, for example, a tapered shape whose width in the Y direction decreases from the upper end portion toward the lower end portion. Alternatively, the plate contact LI has, for example, a bowing shape whose width in the Y direction is largest at a predetermined position between the upper end portion and the lower end portion.

Each of the plate contacts LI includes an insulating layer 55 and a conductive layer 21. The insulating layer 55 is, for example, a silicon oxide layer or the like. The conductive layer 21 is, for example, a tungsten layer or a conductive polysilicon layer.

The insulating layer 55 covers side walls of the plate contact LI that face each other in the Y direction. The conductive layer 21 fills the inner side of the insulating layer 55, and is electrically connected to the source line SL including the intermediate source line BSL at a position different from that in the cross section in FIG. 2B. In addition, as illustrated in FIG. 2B, the conductive layer 21 is connected to the upper layer wiring MX disposed in the insulating layer 54 via a plug V0 disposed in the insulating layer 53. With such a configuration, the plate contact LI functions as a source line contact.

However, instead of the plate contact LI, a plate member filled with an insulating layer may penetrate through the stacked body LM and extend along the X direction, thereby dividing the stacked body LM in the Y direction. In this case, such a plate member does not function as a source line contact.

As illustrated in FIG. 2A, the plurality of pillars PL that penetrates through the stacked body LM, the upper source line DSLb, and the intermediate source line BSL and reaches the lower source line DSLa is dispersedly arranged in the memory region MR.

The plurality of pillars PL serving as a plurality of first pillars are arranged in, for example, a staggered shape when viewed from the stacking direction of the stacked body LM. A cross-sectional shape of each pillar PL in a direction along a layer direction of the stacked body LM, that is, a direction along an XY plane is, for example, a circular shape, an elliptical shape, an oval shape, or the like. In addition, the pillar PL has, for example, a tapered shape of which a diameter and a cross-sectional area decrease from the upper end portion toward the lower end portion. Alternatively, the pillar PL has a bowing shape of which a diameter and a cross-sectional area are largest at a predetermined position between the upper end portion and the lower end portion, for example.

Each of the plurality of pillars PL includes a memory layer ME extending in the stacked body LM in the stacking direction, a channel layer CN penetrating through the stacked body LM and connected to the intermediate source line BSL, a cap layer CP covering the upper surface of the channel layer CN, and a core layer CR serving as a core material of the pillar PL.

As illustrated in FIGS. 2C and 2D, the memory layer ME has a multilayer structure in which a block insulating layer BK, a charge accumulation layer CT, and a tunnel insulating layer TN are stacked in this order from the outer peripheral side of the pillar PL. More specifically, the memory layer ME is disposed on the side surface of the pillar PL except for a depth position of the intermediate source line BSL. The memory layer ME is also disposed on the bottom surface of the pillar PL reaching the lower source line DSLa.

The channel layer CN penetrates through the stacked body LM, the upper source line DSLb, and the intermediate source line BSL and reaches the lower source line DSLa on the inner side of the memory layer ME. The side surface of the channel layer CN is in contact with the intermediate source line BSL and is thus electrically connected to the source line SL including the intermediate source line BSL. The core layer CR fills the further inner side of the channel layer CN.

The cap layer CP is provided at the upper end portion of each of the plurality of pillars PL. The cap layer CP is disposed in the insulating layer 52 so as to cover at least the upper end portion of the channel layer CN, and is connected to the channel layer CN. The cap layer CP is connected to a bit line BL disposed in the insulating layer 54 via a plug CH disposed in the insulating layers 52 and 53.

The block insulating layer BK and the tunnel insulating layer TN of the memory layer ME, and the core layer CR are, for example, silicon oxide layers or the like. The charge accumulation layer CT of the memory layer ME is, for example, a silicon nitride layer or the like. The channel layer CN and the cap layer CP are semiconductor layers such as polysilicon layers or amorphous silicon layers.

As illustrated in FIG. 2D, with the above configuration, a memory cell MC is formed in each portion of the side surface of the pillar PL that faces each word line WL. When a predetermined voltage is applied from the word line WL, data is written to and read from the memory cell MC.

In addition, as illustrated in FIG. 2C, a select gate STD is formed in each of portions of the side surface of the pillar PL that face the select gate lines SGD0 and SGD1 disposed above the word lines WL. In addition, a select gate STS is formed in each of portions of the side surface of the pillar PL that face the select gate lines SGS0 and SGS1 disposed below the word lines WL. When a predetermined voltage is applied from each of the select gate lines SGD and SGS, the select gates STD and STS are turned on or off, so that the memory cells MC of the pillars PL to which the select gates STD and STS belong can be brought into a selected state or a non-selected state.

As illustrated in FIG. 2B, an insulating portion NR, a plate portion BR, the through contact C4, and the columnar portion HRm are disposed in the through contact region TP.

The insulating portion NR serving as a contact portion is surrounded by the stacked body LM when viewed from the stacking direction of the stacked body LM, and is a portion in which a plurality of insulating layers NL serving as a plurality of fourth insulating layers and the plurality of insulating layers OL are alternately stacked one by one. The plurality of insulating layers NL is, for example, silicon nitride layers, and are arranged at height positions corresponding to the plurality of word lines WL and the select gate lines SGD and SGS, respectively.

The plate portion BR is disposed on each of opposite sides of the insulating portion NR in the Y direction. The plate portion BR extends along the X direction in the through contact region TP at a position between the plate contacts LI adjacent to each other in the Y direction, penetrates through the stacked body LM and the upper source line DSLb, and reaches the intermediate insulating layer SCO.

As will be described later, when forming the stacked body LM from a stacked body in which a sacrificial layer and an insulating layer are stacked, the sacrificial layer remains without being replaced with the word line WL or the like at a portion sandwiched between the plate portions BR, and is maintained as the insulating layer NL of the insulating portion NR.

In the insulating portion NR, a plurality of through contacts C4 is arranged, for example, in the X direction (See FIG. 1A). However, the plurality of through contacts C4 may be arranged in the Y direction instead of or in addition to the X direction, in the through contact region TP.

The through contact C4 penetrates through the insulating layer 52 and the insulating portion NR, passes through, for example, an opening OP provided in the source line SL, and reaches the insulating layer 50 covering the peripheral circuit CUA (see FIG. 1A).

The through contact C4 includes an insulating layer 57 covering the outer periphery of the through contact C4, and a conductive layer 23 such as a tungsten layer or a copper layer filling the inner side of the insulating layer 57.

The conductive layer 23 is connected to the upper layer wiring MX disposed in the insulating layer 54 via the plug V0 disposed in the insulating layer 53 above the stacked body LM. In addition, the conductive layer 23 is connected to the peripheral circuit CUA via a lower layer wiring D2 disposed in the insulating layer 50 below the stacked body LM. As a result, the through contact C4 connects the components disposed above and below the stacked body LM.

Since the through contact C4 is disposed in the insulating portion NR that does not include the word line WL or the like and the conductive layer 23 of the through contact C4 is covered with the insulating layer 57, a withstand voltage between the through contact C4 and the word line WL or the like of the stacked body LM is maintained.

In the through contact region TP excluding the insulating portion NR, a plurality of columnar portions HRm penetrating through the stacked body LM, the upper source line DSLb, and the intermediate insulating layer SCO and reaching the lower source line DSLa is dispersedly arranged.

The plurality of columnar portions HRm serving as a plurality of third pillars are arranged in a staggered or grid shape while avoiding interference with the plate contact LI.

A cross-sectional shape of each of the columnar portions HRm in the direction along the XY plane is, for example, a circular shape, an elliptical shape, an oval shape, or the like. In addition, the columnar portion HRm has, for example, a tapered shape of which a diameter and a cross-sectional area decrease from the upper end portion toward the lower end portion. Alternatively, the columnar portion HRm has a bowing shape of which a diameter and a cross-sectional area are largest at a predetermined position between the upper end portion and the lower end portion, for example.

Each of the plurality of columnar portions HRm has the same layer structure as that of the pillar PL described above. However, the plurality of columnar portions HRm is in a floating state as a whole, and does not contribute to the function of the semiconductor memory device 1. As will be described later, the columnar portion HRm has a role of supporting member when forming the stacked body LM from the stacked body in which the sacrificial layer and the insulating layer are stacked.

In addition, as described above, since the columnar portion HRm is disposed while avoiding interference with the plate contact LI, an influence of contact between the columnar portion HRm including a silicon nitride layer or the like corresponding to the charge accumulation layer CT of the pillar PL and the plate contact LI is suppressed.

The columnar portion HRm includes dummy layers MEd, CNd, CRd, and CPd extending in the stacked body LM in the stacking direction, as the same layer structure as that of the pillar PL.

As illustrated in FIG. 2E, the dummy layer MEd serving as a third insulating layer has a multilayer structure in which dummy layers BKd, CTd, and TNd are stacked in this order from the outer peripheral side of the columnar portion HRm.

That is, the dummy layer MEd corresponds to the memory layer ME of the pillar PL described above. Furthermore, the dummy layers BKd, CTd, and TNd included in the dummy layer MEd correspond to the block insulating layer BK, the charge accumulation layer CT, and the tunnel insulating layer TN of the pillar PL, respectively.

However, the dummy layer MEd is disposed without being interrupted on the side surface of the columnar portion HRm from the upper source line DSLb to the lower source line DSLa. The dummy layer MEd is also disposed at the lower end portion of the columnar portion HRm.

The dummy layer CNd penetrates through the stacked body LM, the upper source line DSLb, and the intermediate insulating layer SCO on the inner side of the dummy layer MEd and reaches the lower source line DSLa. The dummy layer CNd corresponds to the channel layer CN of the pillar PL described above.

However, the dummy layer MEd is disposed on the side surface of the dummy layer CNd extending from the upper source line DSLb to the lower source line DSLa, and the dummy layer CNd is not in direct contact with the intermediate insulating layer SCO. The dummy layer CRd serving as a core material of the columnar portion HRm fills the further inner side of the dummy layer CNd. That is, the dummy layer CRd corresponds to the core layer CR of the pillar PL described above.

In addition, the dummy layer CPd is provided at the upper end portion of each of the plurality of columnar portions HRm. The dummy layer CPd is disposed in the insulating layer 52 so as to cover at least the upper end portion of the dummy layer CNd, and is connected to the dummy layer CNd. The dummy layer CPd corresponds to the cap layer CP of the pillar PL described above. Note that the columnar portion HRm does not have to include the dummy layer CPd.

Each layer included in the columnar portion HRm includes the same type of material as that of each corresponding layer of the pillar PL. That is, the dummy layers BKd and TNd of the dummy layer MEd, and the dummy layer CRd are, for example, silicon oxide layers or the like. The dummy layer CTd is, for example, a silicon nitride layer or the like. The dummy layers CNd and CPd are semiconductor layers such as polysilicon layers or amorphous silicon layers. Here, the semiconductor layer included in the dummy layer CNd or the like has, for example, a higher Young's modulus than that of the material included in other dummy layers MEd and CRd, and has a property of being hard and hardly deformed.

FIG. 2B illustrates one side of the through contact regions TP disposed on the opposite sides in the Y direction with one plate contact LI interposed therebetween. The insulating portion NR whose opposite sides in the Y direction are sandwiched between the plate portions BR, the through contact C4 in the insulating portion NR, and the like are disposed on the further left side of the plate contact LI on the left side of FIG. 2B, and the plurality of columnar portions HRm is dispersedly arranged between the plate contacts LI and the plate portions BR.

In addition, the stepped region SR to be described in detail below is disposed on one side from the through contact TP in the Y direction (the right side in the drawing) with the second plate contact LI from the left side of FIG. 2B interposed therebetween.

As illustrated in FIGS. 2A and 2B, the plate contact LI is disposed at a position overlapping the stepped region SR in the X direction, whereby the stepped region SR is divided in the Y direction. In the stepped region SR, stepped portions SP, SPf, and SPs are disposed on opposite sides in the Y direction with the plate contact LI interposed therebetween. The stepped portions SP, SPf, and SPs have a shape in which the plurality of word lines WL and the plurality of insulating layers OL are processed in a stepped shape.

Among these stepped portions SP, SPf, and SPs, the stepped portion SP has a function of electrically drawing the plurality of word lines WL to the upper layer wiring MX. On the other hand, the entire stepped portion SPs and a portion of the stepped portion SPf in which the word lines WL are processed in a stepped shape are dummy stepped portions that do not contribute to the function of the semiconductor memory device 1. Such dummy stepped portions are also disposed at the opposite end portions of the stacked body LM in the X direction and the opposite end portions of the stacked body LM in the Y direction.

The stepped portion SP extends in the X direction at a position close to the through contact TP away from the memory region MR in the X direction, and descends toward the memory region MR. The stepped portion SPf extends in the X direction at a position close to the memory region MR so as to face the stepped portion SP and descends toward the stepped portion SP.

The stepped portion SPs faces a plate contact LI dividing the stepped region SR in the Y direction at a position between the stepped portions SP and SPf, and is disposed in the vicinity of a plate contact LI adjacent to the plate contact LI in the Y direction. The stepped portion SPs descends toward the plate contact LI that the stepped portion Sps faces in the Y direction.

Here, in the entire stepped portion SPs and the portion of the stepped portion SPf in which the word lines WL are processed in the stepped shape, a terrace portion of each step is shorter than the terrace portion of the stepped portion SP. Therefore, the stepped portions SPs and SPf have a steeper shape than the stepped portion SP, and the step length, that is, the length from the uppermost step to the lowermost step is smaller than that of the stepped portion SP.

As the stepped portions SP, SPf, and SPs are disposed in this manner, the stacked body LM has a shape recessed in a mortar shape in the stepped region SR. In this mortar-shaped region, the insulating layer 51 such as a silicon oxide layer is disposed so as to cover the upper surfaces of the stepped portions SP, SPf, and SPs.

The insulating layer 51 serving as a fifth insulating layer is also divided in the Y direction by the plate contact LI dividing the stepped region SR. The insulating layers 52 to 54 also cover the upper surface of the insulating layer 51.

Note that, in the plate contact LI, a portion disposed in the insulating layer 51 tends to have a more greatly tapered or bowing shape than a portion disposed in the stacked body LM. That is, in a case where the plate contact LI has a tapered shape, a difference between the width of the upper end portion and the width of the lower end portion of the plate contact LI tends to be larger in the insulating layer 51. In a case where the plate contact LI has a bowing shape, a difference between the maximum width of the plate contact LI and the widths of the upper and lower end portions of the plate contact LI tends to be larger in the insulating layer 51.

In addition, the larger the distance by which the plate contact LI extends in the stacking direction of the stacked body LM in the insulating layer 51, the more it is likely that the plate contact LI has a more greatly tapered or bowing shape. That is, in the stepped region SR, the tapered shape or bowing shape of the plate contact LI tends to be more remarkable in a region where each lower layer of the stacked body LM is processed in a stepped shape than in a region where each upper layer of the stacked body LM is processed in a stepped shape.

The contact CC penetrating through the insulating layers 52 and 51 is connected to the word line WL and the select gate lines SGD and SGS constituting the respective steps of the stepped portion SP. In addition, the contacts CC connected to the select gate lines SGD0 and SGD1 are also disposed on the terrace surfaces of the select gate lines SGD0 and SGD1 in the stepped portion SPf.

Each contact CC has, for example, a tapered shape of which a diameter and a cross-sectional area decrease from the upper end portion toward the lower end portion. Alternatively, the contact CC has, for example, a bowing shape of which a diameter and a cross-sectional area are largest at a predetermined position between the upper end portion and the lower end portion.

The contact CC includes an insulating layer 56 covering the outer periphery of the contact CC and a conductive layer 22 such as a tungsten layer or a copper layer filling the inner side of the insulating layer 56. The conductive layer 22 is connected to the upper layer wiring MX disposed in the insulating layer 54 via the plug V0 disposed in the insulating layer 53. As described above, the upper layer wiring MX is connected to the through contact C4 of the through contact region TP adjacent in the Y direction via the plate contact LI, for example.

With such a configuration, the word lines WL of the respective layers and the select gate lines SGD and SGS of the upper and lower layers of the word lines WL can be electrically drawn. That is, with the above configuration, a predetermined voltage is applied from the peripheral circuit CUA to the memory cell MC via the through contact C4, the contact CC, the word line WL, and the like, and the memory cell MC can be operated as a memory element.

Here, FIG. 2B illustrates a cross section of the third step from the lowermost step of the stepped portion SP. That is, FIG. 2B illustrates a portion where the lowermost word line WL constitutes the terrace surface. In FIG. 2B, the stepped portion SP is disposed on each of opposite sides in the Y direction of the plate contact LI illustrated in the central portion of the stepped region SR. The stepped portion SPs is one of the stepped portions SP disposed on one side of the plate contact LI that has each stepped portion SP on the both sides in Y direction.

In addition, a plurality of columnar portions HRc penetrating through the insulating layer 51, the stacked body LM, the upper source line DSLb, and the intermediate insulating layer SCO and reaching the lower source line DSLa is dispersedly arranged in a partial region of the stepped region SR including the stepped portions SP, SPf, and SPs.

The plurality of columnar portions HRc serving as a plurality of second pillars are arranged in a staggered or grid shape while avoiding interference with the plate contacts LI and the contacts CC. However, as described later, since the columnar portion HRc is a single insulating layer 59 or the like, interference with the plate contacts LI and the contacts CC is allowed.

A cross-sectional shape of each of the columnar portions HRc in the direction along the XY plane is, for example, a circular shape, an elliptical shape, an oval shape, or the like. In addition, the columnar portion HRc has, for example, a tapered shape of which a diameter and a cross-sectional area decrease from the upper end portion toward the lower end portion. Alternatively, the columnar portion HRc has a bowing shape of which a diameter and a cross-sectional area are largest at a predetermined position between the upper end portion and the lower end portion, for example.

In addition, the larger the distance by which the columnar portion HRc extends in the stacking direction of the stacked body LM in the insulating layer 51, the more it is likely that the columnar portion HRc tends to have a more greatly tapered or bowing shape. That is, in the stepped region SR, it is more likely that the columnar portion HRc tends to have a more greatly tapered or bowing shape from a region where the respective upper layers of the stacked body LM are processed in a stepped shape toward a region where the respective lower layers of the stacked body LM are processed in a stepped shape.

Each of the plurality of columnar portions HRc has a layer structure different from that of the pillar PL described above. More specifically, the columnar portion HRc has a single layer structure of the insulating layer 59 serving as a second insulating layer extending in the stacking direction in the insulating layer 51 and the stacked body LM. The insulating layer 59 is, for example, a silicon oxide layer or the like, and does not contribute to the function of the semiconductor memory device 1. In addition, as described above, interference between the columnar portion HRc and the plate contact LI and the contact CC is allowed.

As will be described later, the columnar portion HRc has a role of supporting member when forming the stacked body LM by using the stacked body in which the sacrificial layer and the insulating layer are stacked, similarly to the above-described columnar portion HRm.

The cross-sectional areas of the columnar portions HRm and HRc in the direction along the XY plane are larger than, for example, the cross-sectional area of the pillar PL in the direction along the XY plane at the same height position of the stacked body LM. In addition, a pitch between the plurality of columnar portions HRm and a pitch between the plurality of columnar portions HRc are larger than, for example, a pitch between the plurality of pillars PL, and arrangement densities of the respective columnar portions HRm and HRc per unit area of the word line WL in the stacked body LM is lower than an arrangement density of the pillars PL per unit area of the word line WL.

As described above, for example, as the pillars PL have a smaller cross-sectional area and a smaller pitch than those of the columnar portions HRm and HRc, a large number of memory cells MC can be formed at high density in the stacked body LM having a predetermined size, and the storage capacity of the semiconductor memory device 1 can be increased. In addition, the columnar portions HRm and HRc are only used to support the stacked body LM and thus do not have a precise configuration with a small cross-sectional area and a small pitch unlike the pillars PL, for example, as a result of which the manufacturing load can be reduced.

Meanwhile, in partial regions of the stepped portions SP and SPf, the above-described columnar portion HRm is disposed instead of the columnar portion HRc. In the stepped region SR, the plurality of columnar portions HRm are arranged in a staggered or grid shape while avoiding interference with the plate contacts LI and the contacts CC. Note that, as described above, since the columnar portion HRm is disposed while avoiding interference with the plate contact LI, an influence of contact between the columnar portion HRm including a silicon nitride layer or the like corresponding to the charge accumulation layer CT and the plate contact LI is suppressed.

FIGS. 3A to 4B illustrate the columnar portions HRc and HRm disposed in the stepped region SR in more detail.

Figure 3A:
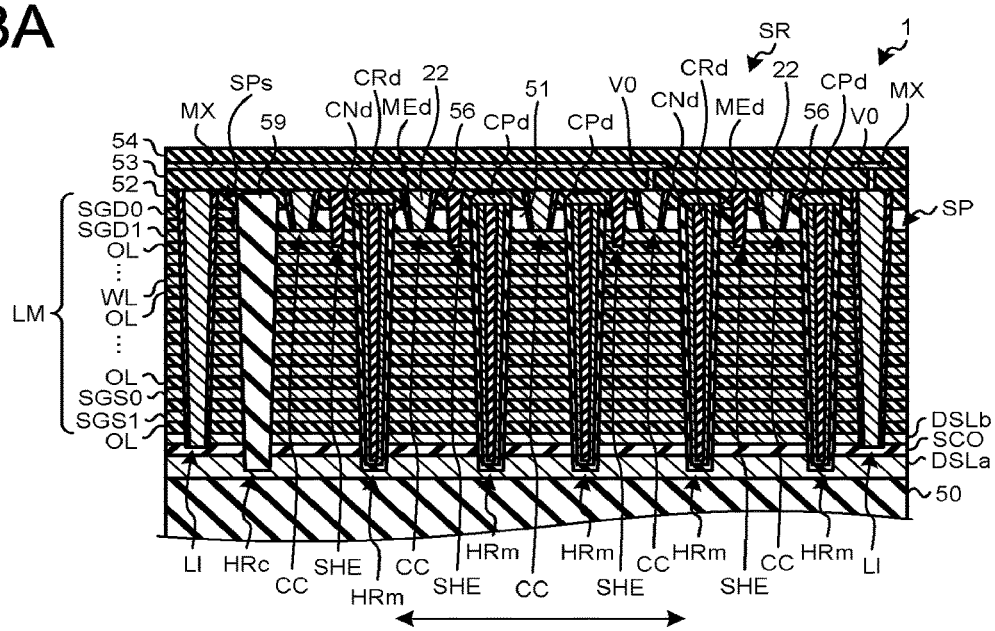
FIGS. 3A to 3C are cross-sectional views, including a stepped portion with different layers in the semiconductor memory device according to the embodiment, in a Y direction.
Figure 3B:
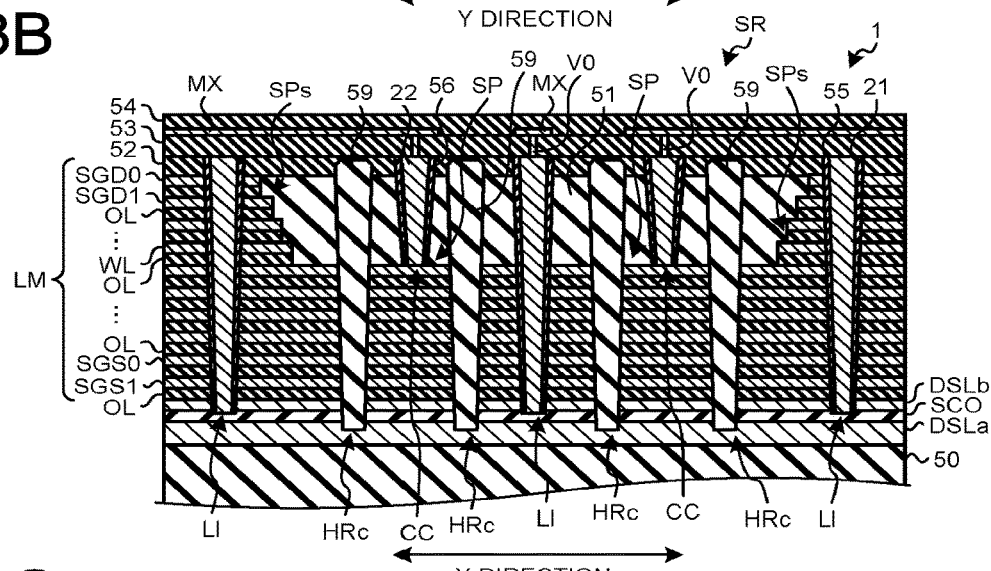
Figure 3C:
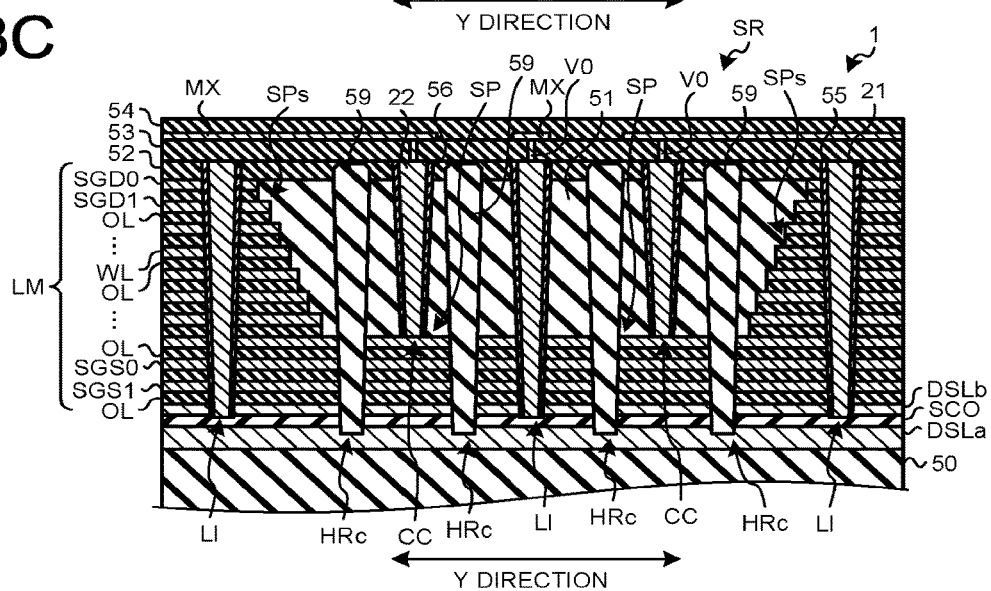

FIGS. 3A to 3C are cross-sectional views, including the stepped portion SP with different layers in the semiconductor memory device 1 according to the embodiment, in the Y direction. As described above, the columnar portions HRm and HRc are disposed in different regions of the stepped region SR, respectively.

More specifically, the plurality of columnar portions HRm is dispersedly arranged in the layers of the select gate lines SGD of the stepped portions SP and SPf, that is, portions where the select gate lines SGD0 and SGD1 are processed in a stepped shape in the X direction. In the stepped region SR, the plurality of columnar portions HRc is disposed in a region other than a region where the columnar portions HRm are disposed. That is, the plurality of columnar portions HRc is disposed in the layers of the word lines WL and the select gate lines SGS of the stepped portions SP and SPf, that is, in a portion where the plurality of word lines WL are processed in a stepped shape in the X direction and a portion where the select gate lines SGS0 and SGS1 are processed in a stepped shape. In addition, the plurality of columnar portions HRc is dispersedly arranged over substantially the entire stepped portion SPs.

FIG. 3A illustrates a cross section in which the select gate line SGD1 constitutes the terrace surface. FIG. 3A illustrates the stepped portion SP of the layers of the select gate lines SGD0 and SGD1 which is an example of a configuration of the upper layers of the stacked body LM. FIG. 3A illustrates a region between the plate contacts LI adjacent in the Y direction, that is, a region corresponding to one block region BLK.

As illustrated in FIG. 3A, in the block region BLK, the select gate line SGD1 is further separated into a plurality of regions by a plurality of isolation layers SHE. The isolation layer SHE is an insulating layer such as a silicon oxide layer that penetrates through the insulating layers 52 and 51 and the select gate lines SGD0 and SGD1 and reaches the insulating layer OL immediately below the select gate line SGD1.

The isolation layer SHE extends substantially in the X direction in the memory region MR away from terminal end portions of the select gate lines SGD0 and SGD1 in the stepped portion SP in the X direction via the through contact region TP, and isolates the select gate lines SGD0 and SGD1 in the memory region MR in the Y direction. Also on the stepped portion SPf side facing the stepped portion SP in the X direction, the isolation layer SHE extends substantially in the X direction in the memory region MR from terminal end portions of the select gate lines SGD0 and SGD1 in the stepped portion SPf in the X direction adjacent to the memory region MR, and isolates the select gate lines SGD0 and SGD1 in the memory region MR in the Y direction.

In other words, since the isolation layer SHE penetrates through one or more conductive layers including the uppermost conductive layer of the stacked body LM and extends along the X direction in the stacked body LM, these conductive layers are separated into sections of one or more select gate lines SGD.

In FIG. 3A, the contact CC that penetrates through the insulating layers 52 and 51 and is connected to the select gate line SGD1 is disposed on each terrace surface of the select gate line SGD1 separated into a plurality of sections by the isolation layer SHE. As a result, a voltage can be applied to the select gate lines SGD0 and SGD1 in the memory region MR on one side of the stepped portion SP in the X direction via the through contact TP.

In addition, each contact CC connected to the select gate line SGD1 separated into a plurality of sections by the isolation layer SHE is disposed also in the stepped portion SPf. As a result, a voltage can be applied to the select gate lines SGD0 and SGD1 in the memory region MR adjacent to the stepped portion SPf on one side in the X direction.

In addition, the plurality of columnar portions HRm is disposed in a region where the select gate line SGD1 constitutes the terrace surface in the stepped portion SP. These columnar portions HRm penetrate through the insulating layers 52 and 51, the select gate line SGD1, and the layers below the select gate line SGD1 of the stacked body LM, further penetrate through the upper source line DSLb and the intermediate insulating layer SCO, and reach the lower source line DSLa.

Similarly, in the stepped portion SP, the plurality of columnar portions HRm that penetrates through the insulating layers 52 and 51, the select gate line SGD0, and the respective layers below the select gate line SGD0 of the uppermost layer of the stacked body LM and reaches the lower source line DSLa is disposed also in a region where the select gate line SGD0 constitutes the terrace surface.

Furthermore, also in the stepped portion SPf, the columnar portions HRm are disposed in a region where the select gate lines SGD0 and SGD1 constitute the terrace surfaces, respectively. On the other hand, in the stepped portion SPs, the columnar portions HRc are disposed in a region where the select gate lines SGD0 and SGD1 constitute the terrace surfaces along the Y direction, respectively.

FIG. 3B illustrates a cross section in which a word line WL on the upper layer of the stacked body LM constitutes the terrace surface, and more specifically, illustrates a portion in which the fourth word line WL from the lowermost word line WL constitutes the terrace surface. FIG. 3C illustrates a cross section in which a word line WL on the lower layer of the stacked body LM constitutes the terrace surface, and more specifically, illustrates a portion in which the lowermost word line WL constitutes the terrace surface.

FIGS. 3B and 3C illustrate the stepped portion SP of the layers of the word lines WL or the select gate lines SGS0 and SGS1 which are examples of a configuration of the lower layers of the stacked body LM. Note that FIGS. 3B and 3C illustrate a region including three plate contacts LI adjacent to one another in the Y direction, that is, a region corresponding to two block regions BLK, and the scale in the lateral direction (Y direction) of FIGS. 3B and 3C is different from that in FIG. 3A described above.

As illustrated in FIGS. 3B and 3C, one contact CC that penetrates through the insulating layers 52 and 51 and is connected to a word line WL is disposed on a terrace surface of the corresponding word line WL in each layer, in one block region BLK.

In addition, in the stepped portion SP, the plurality of columnar portions HRc is disposed in a region where the word line WL in each layer constitutes the terrace surface. These columnar portions HRc penetrate through the insulating layers 52 and 51, the word line WL in which the columnar portions HRc are disposed within the region of the terrace surface, and the layers of below the above mentioned word line WL among the plurality of word lines of the stacked body LM, further penetrate through the upper source line DSLb and the intermediate insulating layer SCO, and reach the lower source line DSLa.

Similarly, in the stepped portion SP, the plurality of columnar portions HRc that penetrates through the insulating layers 52 and 51, and the layers below the select gates line SGS0 and SGS1 of the stacked body LM and reach the lower source line DSLa is disposed also in a region where the select gate lines SGS0 and SGS1 constitute the terrace surfaces.

Furthermore, also in the stepped portion SPf, the columnar portions HRc are disposed in a region where the plurality of word lines WL and the select gate lines SGS0 and SGS1 constitute the terrace surfaces, respectively. As described above, the columnar portions HRc are also disposed in a region where the respective layers of the stepped portion SPs, which include layers from the select gate line SGD0 of the uppermost layer to the select gate line SGS1 of the lowermost layer via the word lines WL of the intermediate layer, constitute the terrace surfaces, respectively.

Figure 4A:
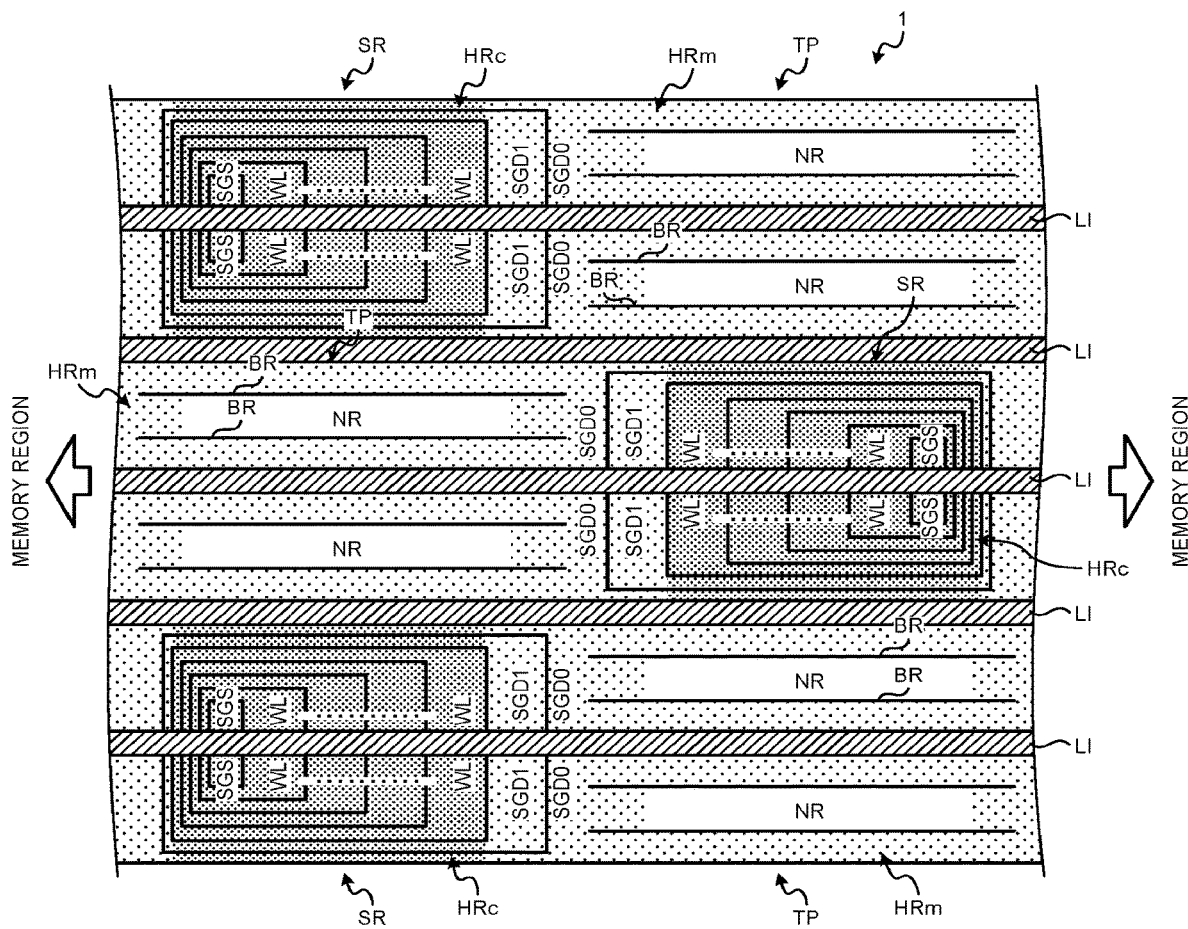
FIGS. 4A and 4B are schematic plan views illustrating arrangement of columnar portions in a stepped region and a through contact region of the semiconductor memory device according to the embodiment.
Figure 4B:
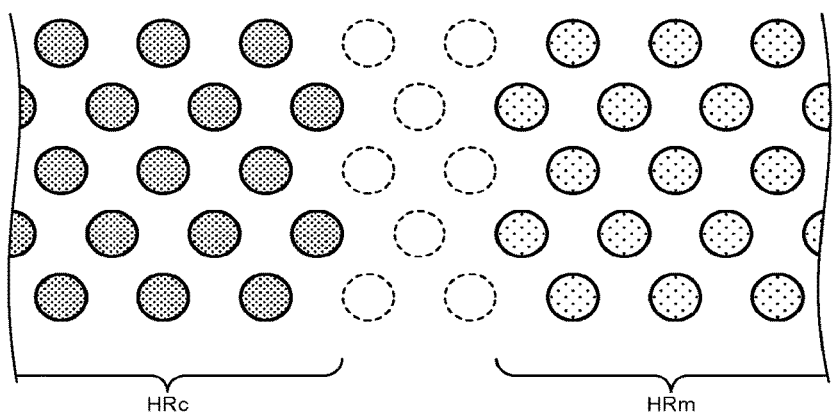

FIGS. 4A and 4B are schematic plan views illustrating arrangement of the columnar portions HRm and HRc in the stepped region SR and the through contact region TP of the semiconductor memory device 1 according to the embodiment. More specifically, FIG. 4A is a plan view illustrating substantially the entire stepped region SR and the entire through contact region TP. FIG. 4B is a partially enlarged plan view of a boundary portion between the columnar portions HRm and HRc in the X direction.

As illustrated in FIG. 4A, in the stepped region SR and the through contact region TP of the semiconductor memory device 1, the plurality of columnar portions HRc is disposed in a portion where the plurality of word lines WL and the select gate lines SGS0 and SGS1 in the stepped region SR have a stepped shape while avoiding interference with the plate contacts LI and the contacts CC.

In addition, in the stepped portion SPs in the stepped region SR of the semiconductor memory device 1, the columnar portions HRc are disposed in substantially the entire portion where the plurality of word lines WL and the select gate lines SGD and SGS have a stepped shape. That is, in the stepped region SR, the columnar portions HRc are dispersedly arranged over the entire region where the stepped portion SPs extends along the Y direction from the lowermost layer of the stepped portion SPs to a position adjacent to an adjacent plate contact LI in the Y direction.

In the stepped region SR and the through contact region TP of the semiconductor memory device 1, the columnar portions HRm are disposed in a region of the stacked body LM other than the above. That is, the columnar portions HRm are disposed, in the stepped region SR, in a region along the X direction corresponding to a portion where the select gate lines SGD0 and SGD1 of the stepped portions SP and SPf are processed in a stepped shape, and in a region of the through contact region TP excluding the insulating portion NR, that is, a region between the plate contact LI and the plate portion BR adjacent to each other in the Y direction, while avoiding interference with the plate contacts LI and the contacts CC. On the other hand, it is preferable that none of the columnar portions HRm and HRc is disposed in the insulating portion NR of the through contact region TP, particularly in a region between portions penetrated by the plurality of through contacts C4.

In addition, the plurality of columnar portions HRm and HRc may also be dispersedly arranged in the dummy stepped portions at opposite end portions of the stacked body LM in the X direction and the Y direction. In this case, the columnar portions HRm may be disposed in a portion where the select gate lines SGD0 and SGD1 of the stacked body LM constitute the terrace surfaces in the dummy stepped portion. Furthermore, in the dummy stepped portion, the columnar portions HRc may be disposed in a portion where the plurality of word lines WL and the select gate lines SGS0 and SGS1 of the stacked body LM constitute the terrace surfaces.

As illustrated in FIG. 4B, in the boundary portion between the columnar portions HRm and HRc in the X direction, it is preferable to provide an interval corresponding to two to three columns of the columnar portions HRm and HRc in a periodic pattern formed by the entire columnar portions HRm and HRc. As will be described later, the columnar portions HRm and HRc are formed through different processings. As an interval is provided at the boundary portion between the columnar portions HRm and HRc in the X direction as described above, a region where the columnar portions HRc are disposed can be covered with a mask layer or the like at the time of forming the columnar portions HRm, and a region where the columnar portions HRm are disposed can be covered with a mask layer or the like at the time of forming the columnar portions HRc, the columnar portions HRm and HRc can be easily formed separately.

Meanwhile, the plate contact LI is disposed at the boundary portion between the columnar portions HRm and HRc in the Y direction. Therefore, in the stepped region SR and the through contact region TP, even if the columnar portions HRm and HRc are disposed also in the vicinity of the plate contact LI, the columnar portions HRm and HRc can be separately formed.

(Method for Manufacturing Semiconductor Memory Device)

Next, a method for manufacturing the semiconductor memory device 1 according to the embodiment will be described with reference to FIGS. 5A to 13Bc. FIGS. 5A to 13Bc are views sequentially illustrating a part of a procedure of the method for manufacturing the semiconductor memory device 1 according to the embodiment. Note that it is assumed that the peripheral circuit CUA has been formed on the substrate SB and the insulating layer 50 covering the peripheral circuit CUA has been formed before the processings illustrated in FIGS. 5A to 13Bc.

Figure 5A:
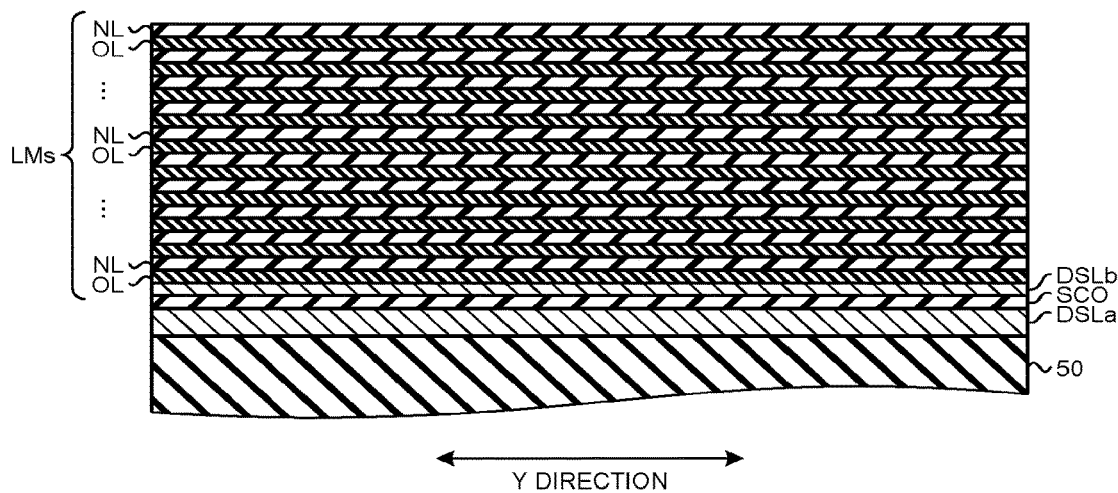
FIGS. 5A to 5C are views sequentially illustrating a part of a procedure of a method for manufacturing the semiconductor memory device according to the embodiment.

First, FIGS. 5A to 6B illustrate how the stepped portion SP including the columnar portions HRc is formed. FIGS. 5A to 5C illustrate a cross-section, of a region to be the stepped region SR later, in the Y direction.

As illustrated in FIG. 5A, the lower source line DSLa, the intermediate insulating layer SCO, and the upper source line DSLb are formed in this order on the insulating layer 50. The intermediate insulating layer SCO is, for example, a silicon oxide layer or the like.

In addition, a stacked body LMs in which a plurality of insulating layers NL and a plurality of insulating layers OL are alternately stacked one by one is formed above the upper source line DSLb. The insulating layers NL are, for example, silicon nitride layers or the like, and function as sacrificial layers that are later replaced with a conductive material and become the word lines WL and the select gate lines SGD and SGS.

Figure 5B:
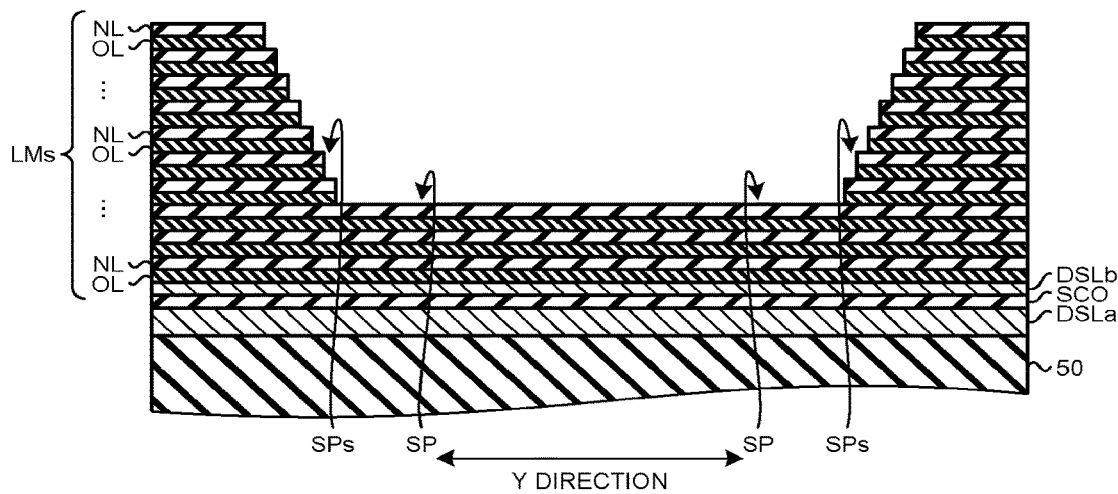

As illustrated in FIG. 5B, in a partial region of the stacked body LMs, the insulating layer NL and the insulating layer OL are dug down in a stepped shape to form the stepped portion SP. The stepped portion SP is formed by repeating slimming of a mask pattern such as a photoresist layer and etching of the insulating layer NL and the insulating layer OL of the stacked body LMs multiple times.

That is, a mask pattern having an opening corresponding to a position where the stepped portion SP is to be formed is formed on the upper surface of the stacked body LMs, and for example, the insulating layer NL and the insulating layer OL are etched away one by one. The end portion of the opening in the mask pattern is retracted to widen the opening by processing using oxygen plasma or the like, and the insulating layer NL and the insulating layer OL are further etched away one by one. The insulating layer NL and the insulating layer OL in the opening of the mask pattern are dug down in a stepped shape by repeating such processing multiple times.

Further, every time the above processing is repeated a predetermined number of times, the mask pattern is newly formed again so that the thickness of the mask pattern that is equal to or more than a predetermined value is maintained. At this time, the stepped portion SP that is relatively gently inclined and the steep dummy stepped portions SPf and SPs are formed by adjusting the position of the opening of the mask pattern. Similarly, by adjusting the positions of the end portions of the mask pattern at the opposite end portions of the stacked body LMs in the X direction and the opposite end portions of the stacked body LMs in the Y direction, steep dummy stepped portions are formed at the four end portions of the stacked body LMs, respectively, similarly to the stepped portions SPf and SPs.

FIG. 5B is a cross-sectional view of the third step from the lowermost step of the stepped portion SP formed in this manner. More specifically, FIG. 5B and FIGS. 5C to 6B following FIG. 5B illustrate the stepped portion SP of the layers to be the word line WL or the select gate lines SGS0 and SGS1 later which are examples of the configuration of the lower layers of the stacked body LMs.

The cross section illustrated in FIG. 5B is separated into two stepped portions SP by the plate contact LI to be formed later. The stepped portion SPs is formed on one side of the stacked body LMs of each stepped portion SP in the Y direction.

Figure 5C:
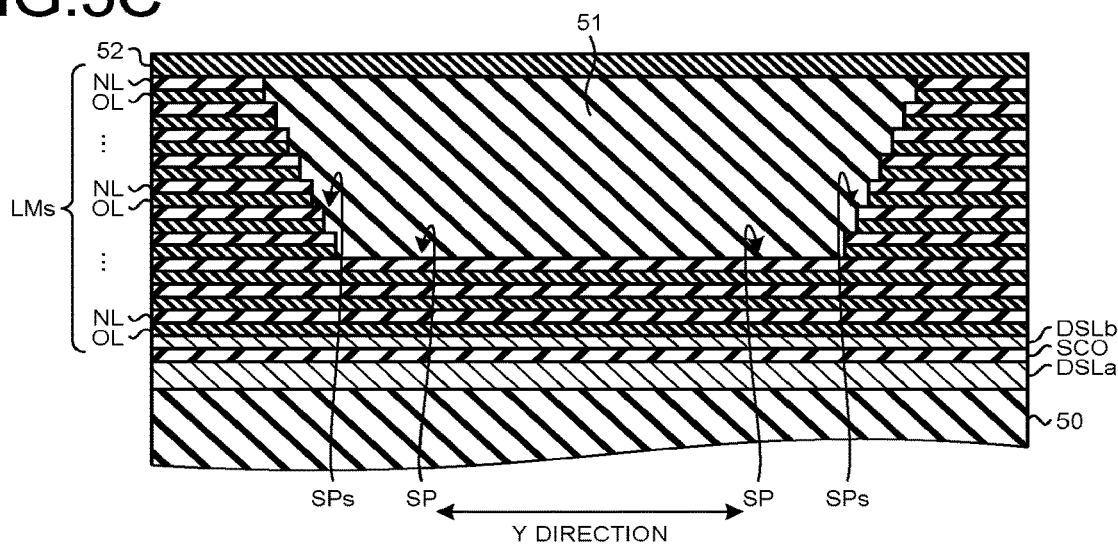

As illustrated in FIG. 5C, the insulating layer 51 such as a silicon oxide layer covering the stepped portion SP and reaching the height of the upper surface of the stacked body LMs is formed. That is, the insulating layer 51 is formed in a mortar-shaped region surrounded by the stepped portions SP, SPs, and SPf. The insulating layer 51 is also formed in a peripheral region of the stacked body LMs having the four end portions at which the dummy stepped portions are formed, respectively.

The insulating layer 52 covering the stacked body LMs and the insulating layer 51 is further formed on the upper surface of the stacked body LMs and the upper surface of the insulating layer 51.

Figure 6A:
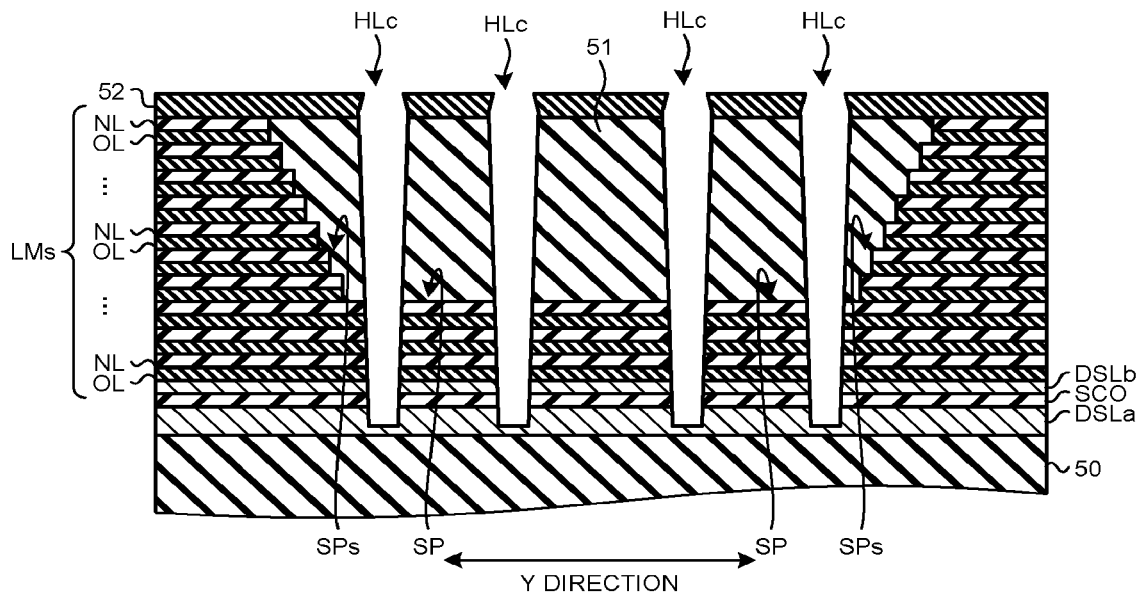
FIGS. 6A and 6B are views sequentially illustrating a part of the procedure of the method for manufacturing the semiconductor memory device according to the embodiment.

As illustrated in FIG. 6A, a plurality of holes HLc penetrating through the insulating layers 52 and 51, the stacked body LMs, the upper source line DSLb, and the intermediate insulating layer SCO and reaching the lower source line DSLa are formed in the mortar-shaped region surrounded by the stepped portions SP, SPs, and SPf.

Figure 6B:
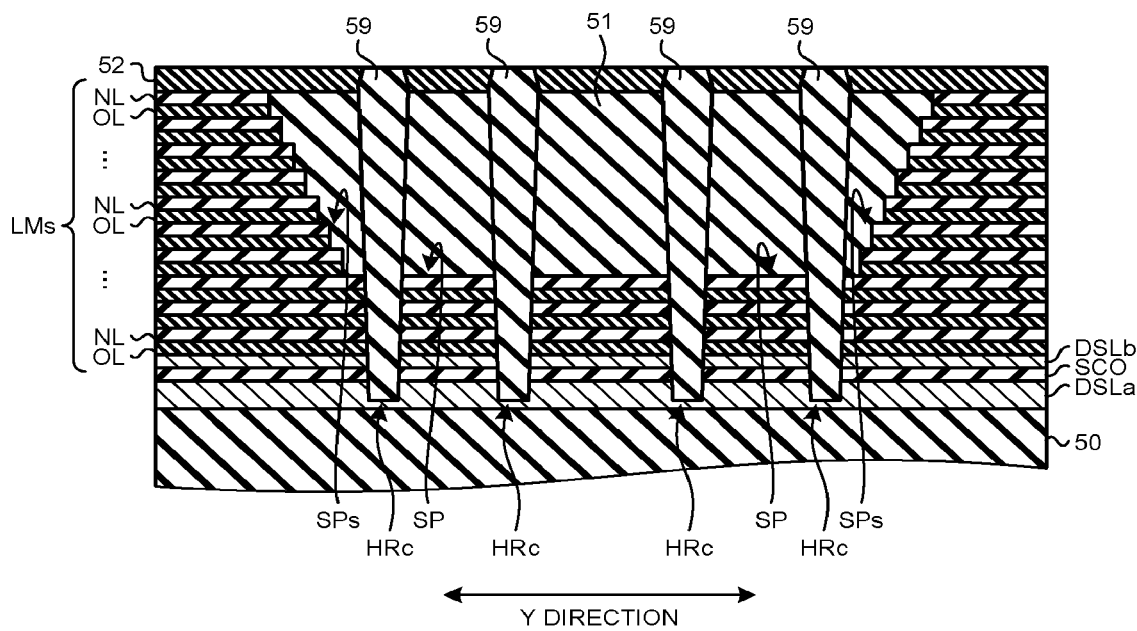

As illustrated in FIG. 6B, the holes HLc are filled with the insulating layer 59. As described above, the plurality of columnar portions HRc is formed in the stepped portion SP. At this time, the plurality of columnar portions HRc is also formed in the stepped portions SPf and SPs and the dummy stepped portions disposed at the four end portions of the stacked body LM.

Next, FIGS. 7Aa to 9Bc illustrate how the pillars PL and the columnar portions HRm are formed.

FIGS. 7Aa to 9Bc illustrate a cross section, of a region to be the memory region MR later, in the Y direction and cross sections, of a region including the stepped portion SP, in the Y direction. That is, Aa to Ac in FIGS. 7Aa to 9Bc are cross-sectional views, of the region to be the memory region MR later, in the Y direction, and Ba to Bc in FIGS. 7Aa to 9Bc illustrate processings corresponding to Aa to Ac in FIGS. 7Aa to 9Bc for the cross section, of the region including the stepped portion SP, in the Y direction.

More specifically, Ba to Bc in FIGS. 7Aa to 9Bc illustrate a cross section in which the second insulating layer NL from the uppermost layer of the stacked body LMs constitutes the terrace surface, and illustrate the stepped portion SP of the layers, which are an example of a configuration of the upper layer side, to be the select gate lines SGD0 and SGD1 later, of the stacked body LMs.

As illustrated in FIG. 7Aa, in a region where the memory region MR is to be formed, the stacked body LMs is formed above the lower source line DSLa, an intermediate sacrificial layer SCN, and the upper source line DSLb, and the insulating layer 52 is formed on the stacked body LMs. The intermediate sacrificial layer SCN includes a silicon nitride layer or the like, and is later replaced with a conductive polysilicon layer or the like to become the intermediate source line BSL. In this state, a plurality of memory holes MH penetrating through the insulating layer 52 and the stacked body LMs and reaching the lower source line DSLa is formed.

As illustrated in FIG. 7Ab, in the memory hole MH, the memory layer ME in which the block insulating layer BK, the charge accumulation layer CT, and the tunnel insulating layer TN are stacked in this order from the outer peripheral side of the memory hole MH is formed. The memory layer ME is also formed on the upper surface of the insulating layer 52. As described above, the block insulating layer BK and the tunnel insulating layer TN are, for example, silicon oxide layers or the like, and the charge accumulation layer CT is, for example, a silicon nitride layer or the like.

As illustrated in FIG. 7Ac, the channel layer CN such as a polysilicon layer or an amorphous silicon layer is formed on the inner side of the memory layer ME. The channel layer CN is also formed above the upper surface of the insulating layer 52 while having the memory layer ME interposed therebetween.

Further, the core layer CR such as a silicon oxide layer fills the further inner side of the channel layer CN. The core layer CR is also formed above the upper surface of the insulating layer 52 while having the memory layer ME and the channel layer CN interposed therebetween.

As illustrated in FIG. 7Ba, in the stepped portion SP, a plurality of holes HLm that penetrates through the insulating layers 52 and 51, the second insulating layer NL from the uppermost layer of the stacked body LMs, the respective layers below the above mentioned second insulating layer NL, the upper source line DSL, and the intermediate insulating layer SCO and reaches the lower source line DSLa is formed, in parallel with the processing of FIG. 7Aa for the memory hole MH.

As illustrated in FIG. 7Bb, the dummy layer MEd in which the dummy layers BKd, CTd, and TNd are stacked in this order from the outer peripheral side of the hole HLm is formed in the hole HLm of the stepped portion SP, in parallel with the processing of FIG. 7Ab for the memory hole MH. The dummy layer MEd is formed on the upper surface of the insulating layer 52 also in a region around the hole HLm.

As illustrated in FIG. 7Bc, the dummy layer CNd such as a polysilicon layer or an amorphous silicon layer is formed on the inner side of the dummy layer MEd, in parallel with the processing of FIG. 7Ac for the memory hole MH. The dummy layer CNd is also formed above the upper surface of the insulating layer 52 around the hole HLm while having the dummy layer MEd interposed therebetween.

Furthermore, the dummy layer CRd such as a silicon oxide layer fills the further inner side of the dummy layer CNd. The dummy layer CRd is also formed above the upper surface of the insulating layer 52 around the hole HLm while having the dummy layers MEd and CNd interposed therebetween.

The processings illustrated in FIGS. 7Ba to 7Bc are also performed on regions of the stepped portion SPf to be the terrace surfaces of the select gate lines SGD0 and SGD1 later and a region of the stacked body LMs to be the through contact region TP later. Furthermore, the processings illustrated in FIGS. 7Ba to 7Bc are also performed on the dummy stepped portions at the four end portions of the stacked body LMs.

While the processings of FIGS. 6A and 6B are performed, the memory region MR, the upper layers of the stacked body LMs in the stepped region SR, and the through contact region TP to be subjected to the processings of FIGS. 7Aa to 7Bc are protected with a mask layer such as a photoresist layer. In addition, while the processings of FIGS. 7Aa to 7Bc are performed, the lower layers of the stacked body LMs in the stepped region SR to be subjected to the processing of FIGS. 6A and 6B are protected with a mask layer such as a photoresist layer.

In addition, the processing order of the above-described processings of FIGS. 6A to 7Bc can be changed. That is, the processings of FIGS. 7Aa to 7Bc may be performed prior to the processings of FIGS. 6A and 6B. Alternatively, some processings of FIGS. 6A to 7Bc may be performed in parallel. For example, the memory holes MH and the holes HLm and HLc can be collectively formed.

Here, the memory holes MH and the holes HLm and HLc can have a tapered shape or a bowing shape. At this time, in a case where the memory holes MH and the holes HLm and HLc are collectively formed, the hole HLc extending in the insulating layer 51 in the stacking direction of the stacked body LMs is more likely to have a tapered shape or a bowing shape than the memory holes MH and the holes HLm extending in the stacking direction of the stacked body LMs. This is because the insulating layer 51 as a single body such as a silicon oxide layer is inferior in hardness to the stacked body LMs in which the plurality of insulating layers NL and OL are alternately stacked.

On the other hand, the hole HLm formed on the upper layers of the stacked body LMs in the stepped region SR extends by a relatively small distance in the insulating layer 51 in the stacking direction of the stacked body LMs. Therefore, it is considered that there is not much difference in degree at which a hole is tapered or bowed between the hole HLm formed in the stacked body LMs to be the through contact region TP later and the hole HLm formed on the upper layers of the stacked body LMs in the stepped region SR.

As illustrated in FIG. 8Aa, the core layer CR on the upper surface of the insulating layer 52 and in the memory hole MH is etched back. At this time, a portion of the core layer CR in the memory hole MH is recessed by etching the core layer CR while taking a selectivity with respect to the channel layer CN using the underlying channel layer CN as a stopper layer, as a result of which a recess DN is formed at the upper end portion of the memory hole MH. Further, the core layer CR on the upper surface of the insulating layer 52 is removed to expose the channel layer CN.

As illustrated in FIG. 8Ab, the channel layer CN on the upper surface of the insulating layer 52 and in the memory hole MH is etched back. At this time, by etching the channel layer CN while taking a selectivity with respect to the memory layer ME using the underlying memory layer ME as a stopper layer, a portion of the channel layer CN in the memory hole MH retracts downward, and the recess DN at the upper end portion of the memory hole MH is expanded. The upper end portion of the core layer CR protrudes at the central portion of the recess DN. In addition, the channel layer CN on the upper surface of the insulating layer 52 is removed to expose the memory layer ME.

As illustrated in FIG. 8Ac, the memory layer ME on the upper surface of the insulating layer 52 and in the memory hole MH is etched back. At this time, the etching amount is adjusted so that the underlying insulating layer 52 is not removed. As a result, a portion of the memory layer ME in the memory hole MH retracts downward, and the recess DN at the upper end portion of the memory hole MH is further expanded. The upper end portion of the core layer CR protruding at the central portion of the recess DN is also removed, so that the bottom surface of the recess DN becomes substantially flat. In addition, the memory layer ME on the insulating layer 52 is removed to expose the insulating layer 52.

The processings of FIGS. 8Aa to 8Ac are controlled so that the bottom surface of the recess DN remains at the height position in the insulating layer 52 and does not reach the uppermost insulating layer NL after the processing of FIG. 8Ac.

As illustrated in FIG. 8Ba, the dummy layer CRd on the upper surface of the insulating layer 52 around the hole HLm and in the hole HLm is etched back in the stepped portion SP by the processing of FIG. 8Aa for the memory hole MH, as a result of which a recess DNr is formed at the upper end portion of the hole HLm. Further, the dummy layer CRd on the upper surface of the insulating layer 52 is removed to expose the dummy layer CNd.

As illustrated in FIG. 8Bb, the dummy layer CNd on the upper surface of the insulating layer 52 around the hole HLm and in the hole HLm is etched back by the processing of FIG. 8Ab for the memory hole MH, as a result of which the recess DNr at the upper end portion of the hole HLm is expanded. The upper end portion of the dummy layer CRd protrudes at the central portion of the recess DNr. In addition, the dummy layer CNd on the upper surface of the insulating layer 52 is removed to expose the dummy layer MEd.

As illustrated in FIG. 8Bc, the dummy layer MEd on the upper surface of the insulating layer 52 around the hole HLm and in the hole HLm is etched back by the processing of FIG. 8Ac for the memory hole MH, as a result of which the recess DNr at the upper end portion of the hole HLm is further expanded. The upper end portion of the dummy layer CRd protruding at the central portion of the recess DNr is also removed, so that the bottom surface of the recess DNr becomes substantially flat. Furthermore, the dummy layer MEd on the insulating layer 52 is removed to expose the insulating layer 52.

As illustrated in FIGS. 9Aa and 9Ba, the inner portions of the recesses DN and DNr are filled with a polysilicon layer, an amorphous silicon layer, or the like to form the cap layer CP and the dummy layer CPd, respectively. As a result, the pillars PL are formed in a region to be the memory region MR later. In addition, the columnar portions HRm are formed on the upper layers of the stacked body LMs in the stepped region SR.

As illustrated in FIGS. 9Ab and 9Bb, the insulating layer 52 is etched back together with the upper surface of each of the cap layer CP and the dummy layer CPd. As a result, the thicknesses of the insulating layer 52, the cap layer CP, and the dummy layer CPd are reduced.

As illustrated in FIGS. 9Ac and 9Bc, the thickness of the insulating layer 52 reduced by etching-back is increased by additionally stacking the insulating layer 52. As a result, the upper surfaces of the cap layer CP and the dummy layer CPd are covered with the insulating layer 52. However, at this stage, the channel layer CN of the pillar PL is entirely covered with the memory layer ME, and is not connected to the intermediate sacrificial layer SCN to be the intermediate source line BSL later.

In addition, the upper surface of the columnar portion HRc formed on the lower layers of the stacked body LMs in the stepped region SR is etched back by the processings of FIGS. 9Ab and 9Bb and FIGS. 9Ac and 9Bc, and is further covered with the insulating layer 52.

Note that the columnar portion HRm is a dummy component that does not contribute to the function of the semiconductor memory device 1. Therefore, the columnar portion HRm does not have to include the dummy layer CPd, and the processing of FIG. 9Ba does not have to be performed on the columnar portion HRm. In this case, the recess DNr of the columnar portion HRm can be backfilled with, for example, the insulating layer 52 or the like.

Next, FIGS. 10A to 12Bb illustrate how the intermediate source line BSL and the word line WL are formed.

Similarly to Aa to Ac and the like in FIGS. 7Aa to 9Bc described above, FIGS. 10A to 11C illustrate a cross section, of a region to be the memory region MR later, in the Y direction.

As illustrated in FIG. 10A, a slit ST that penetrates through the insulating layer 52, the stacked body LMs, and the upper source line DSLb and reaches the intermediate sacrificial layer SCN is formed. The slit ST also extends along the X direction in the stacked body LMs.

At this time, the slit ST may have a tapered shape or a bowing shape. In addition, due to a difference in hardness between the stacked body LMs in which the plurality of insulating layers NL and OL are alternately stacked and the insulating layer 51 which is a single body such as a silicon oxide layer, the degree at which the slit ST is tapered or bowed becomes more remarkable in the stepped region SR covered with the insulating layer 51. In the stepped region SR, the degree at which the slit ST is tapered or bowed increases toward the stepped part on the lower layer side where an extending distance of the slit ST in the stacking direction of the stacked body LMs in the insulating layer 51 increases.

As illustrated in FIG. 10B, an insulating layer 55p is formed on the side walls of the slit ST facing each other in the Y direction.

In parallel with the processings of FIGS. 10A and 10B, a contact hole to be the through contact C4 later and a slit to be the plate portion BR later may be formed in the through contact region TP.

That is, when forming the slit ST in FIG. 10A, a contact hole that penetrates through the insulating layer 52, the stacked body LMs, and the source line SL and reaches the insulating layer 50 is formed. In addition, a slit that penetrates through the insulating layer 52, the stacked body LMs, and the upper source line DSLb and reaches the intermediate insulating layer SCO is formed so as to sandwich the contact hole from opposite sides in the Y direction.

Further, when forming the insulating layer 55p on the side walls of the slit ST in FIG. 10B, an insulating layer is formed on the side walls and the bottom surfaces of the contact hole and the slit. Thereafter, a sacrificial layer such as an amorphous silicon layer fills the further inner side of the insulating layer in the contact hole, and the contact hole is protected so as not to be affected by subsequent processing.

As illustrated in FIG. 10C, a removing liquid for the intermediate sacrificial layer SCN such as a hot phosphoric acid is caused to flow through the slit ST whose side walls are protected by the insulating layer 55p, and the intermediate sacrificial layer SCN sandwiched between the lower source line DSLa and the upper source line DSLb is removed.

As a result, a gap layer GPs is formed between the lower source line DSLa and the upper source line DSLb. Further, a part of the memory layer ME in the outer peripheral portion of the pillar PL is exposed in the gap layer GPs. At this time, since the side walls of the slit ST are protected by the insulating layer 55p, removal of the insulating layer NL in the stacked body LMs is also suppressed.

As illustrated in FIG. 11A, a chemical liquid is appropriately caused to flow into the gap layer GPs through the slit ST to sequentially remove the block insulating layer BK, the charge accumulation layer CT, and the tunnel insulating layer TN exposed in the gap layer GPs, respectively. As a result, the memory layer ME is removed from a part of the side wall of the pillar PL, and a part of the channel layer CN on the inner side is exposed in the gap layer GPs.

As illustrated in FIG. 11B, for example, a source gas such as amorphous silicon is injected from the slit ST whose side walls are protected by the insulating layer 55p to fill the gap layer GPs with the amorphous silicon or the like. In addition, the substrate SB is subjected to heat treatment to polycrystallize the amorphous silicon filling the gap layer GPs, thereby forming the intermediate source line BSL containing polysilicon or the like.

As a result, a part of the channel layer CN of the pillar PL is connected to the source line SL at the side wall via the intermediate source line BSL.

As illustrated in FIG. 11C, the insulating layer 55p on the side walls of the slit ST is removed once.

It is preferable that columnar portion HRm that is a dummy component does not have electrical conduction with the source line SL. As described above, in the stepped region SR, the through contact region TP, and the like excluding the memory region MR, the intermediate sacrificial layer SCN is not disposed between the lower source line DSLa and the upper source line DSLb, and the intermediate insulating layer SCO is disposed between the lower source line DSLa and the upper source line DSLb. Therefore, in the processings of FIGS. 10A to 11C, in the stepped region SR, the through contact region TP, and the like, the removal of the intermediate sacrificial layer SCN, the removal of the dummy layer MEd of the columnar portion HRm, the formation of the intermediate source line BSL, and the like are not performed.

Figure 12B:
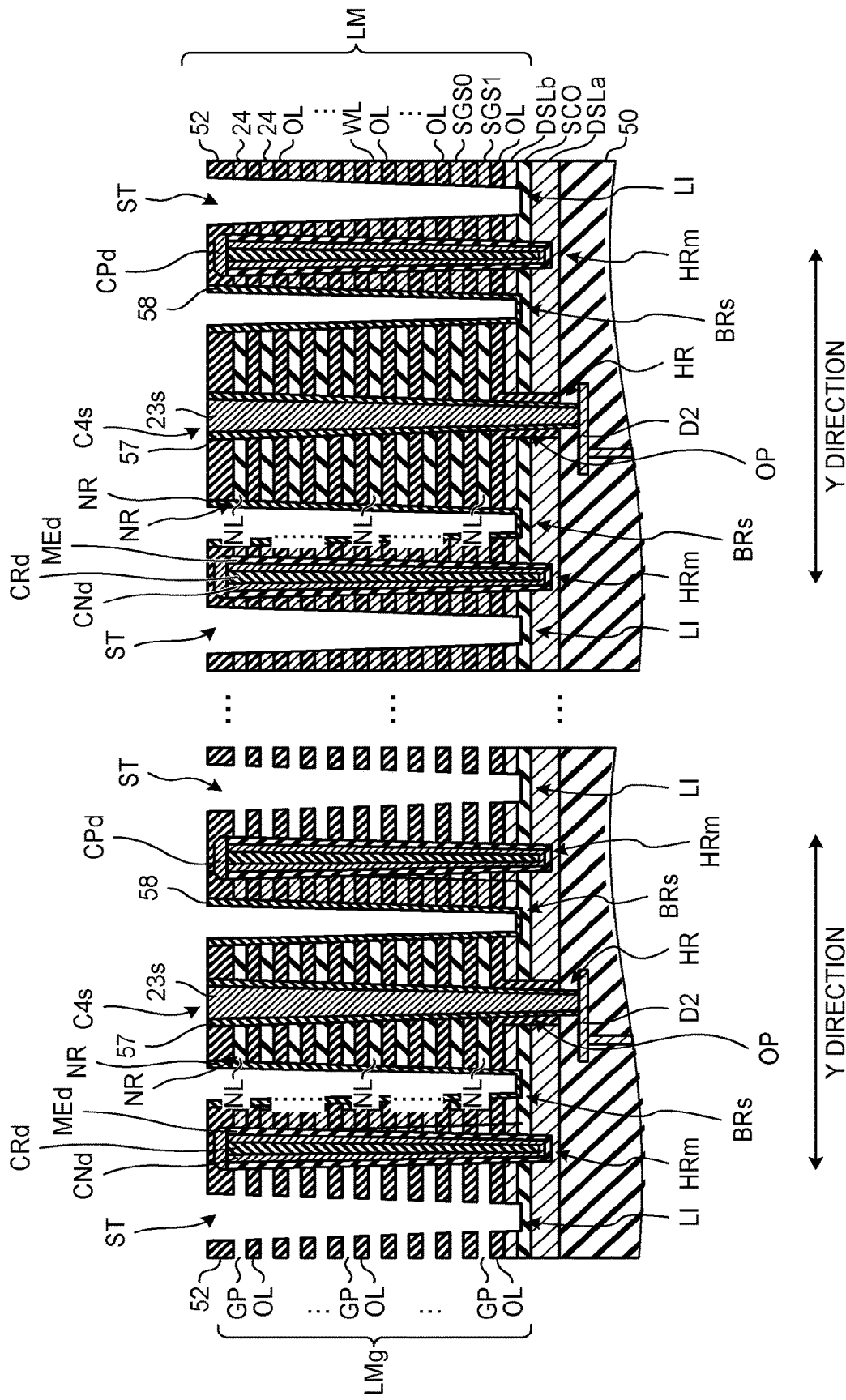
FIGS. 12Aa to 12Bb are views sequentially illustrating a part of the procedure of the method for manufacturing the semiconductor memory device according to the embodiment.

FIGS. 12Aa to 12Bb illustrate a cross section, of a region to be the memory region MR later, in the Y direction and a cross section, of a region to be the through contact region TP later, in the Y direction. That is, FIGS. 12Aa and 12Ab are cross-sectional views, of the region to be the memory region MR later, in the Y direction, similarly to FIGS. 10A to 11C and the like described above. FIGS. 12Ba and 12Bb illustrate the cross section, of the region to be the through contact region TP later, in the Y direction, while showing processings corresponding to FIGS. 12Aa and 12Ab, respectively.

As illustrated in FIG. 12Aa, for example, a removing liquid for the insulating layers NL such as a hot phosphoric acid is caused to flow into the stacked body LMs from the slit ST from which the insulating layer 55p on the side walls thereof has been removed to remove the insulating layers NL of the stacked body LMs. As a result, a stacked body LMg including a plurality of gap layers GP obtained by removing the insulating layers NL between the insulating layers OL is formed.

As illustrated in FIG. 12Ba, in the region to be the through contact region TP later, the insulating layer 57 is formed on the side wall and the bottom surface, and a contact hole C4s in which the inner side of the insulating layer 57 is filled with a sacrificial layer 23s is formed. In addition, slits BRs each having the side walls and the bottom surface on which an insulating layer 58 is formed are formed so as to sandwich the contact hole C4s from opposite sides in the Y direction.

Also in the through contact region TP in such a state, the insulating layers NL are removed by the above processing in the memory region MR, as a result of which the stacked body LMg including a plurality of gap layers GP is formed. However, since a region where the contact hole C4s is formed is shielded by the slits BRs sandwiching the region from opposite sides in the Y direction, the removing liquid for the insulating layers NL does not flow into the region. Therefore, in this region, the insulating layers NL between the insulating layers OL are maintained.

Note that the stacked body LMg including the plurality of gap layers GP has a fragile structure. In the memory region MR, the plurality of pillars PL supports such a fragile stacked body LMg. The plurality of columnar portions HRc supports the stacked body LMg on the lower layers of the stacked body LMs in the stepped region SR. The plurality of columnar portions HRm supports the stacked body LMg on the upper layers of the stacked body LMs in the stepped region SR, and in the through contact region TP. The plurality of columnar portions HRm and HRc support the stacked body LMg also in the dummy stepped portions at opposite end portions of the stacked body LMg in the X direction and the Y direction.

Such a support structure of the pillars PL and the columnar portions HRm and HRc suppresses bending of the remaining insulating layers OL and distortion and collapse of the stacked body LMg.

In addition, as described above, in the insulating portion NR sandwiched between the slits BRs and from which the insulating layer NL is not removed, the strength of the stacked body LMs is maintained without disposing any of the columnar portions HRm and HRc.

As illustrated in FIGS. 12Ab and 12Bb, a source gas of a conductive material such as tungsten or molybdenum is injected from the slit ST into the stacked body LMg, and the gap layers GP of the stacked body LMg are filled with the conductive material to form the plurality of word lines WL. As a result, the stacked body LM in which the plurality of word lines WL and the plurality of insulating layers OL are alternately stacked one by one is formed. In addition, the select gate lines SGS0 and SGS1 are formed below the lowermost word line WL while having the insulating layer OL interposed therebetween.

However, in the region where the insulating layers NL remain, the word line WL and the like are not formed, and the insulating portion NR in which the plurality of insulating layers NL and the plurality of insulating layers OL are alternately stacked is formed.

As described above, the processing of forming the intermediate source line BSL from the intermediate sacrificial layer SCN and the processing of forming the word line WL from the insulating layer NL are also referred to as replacement processing.

In the replacement processing of forming the word line WL and the like, after the insulating layer NL of the stacked body LMs is removed through the slit ST, a layer containing a metal oxide such as aluminum oxide may be formed on the inner wall of the gap layer GP prior to filling the gap layer GP with the conductive material. In this case, layers containing a metal oxide are formed on the upper and lower surfaces of the insulating layer OL in the stacking direction of the stacked body LM. In addition, a layer containing a barrier metal such as titanium, titanium nitride, tantalum, or tantalum nitride for suppressing diffusion of tungsten, molybdenum, or the like into other layers may be further interposed between such a layer containing a metal oxide and the conductive material such as tungsten or molybdenum.

Here, in FIGS. 12Ab and 12Bb, a conductive layer 24 is formed above the uppermost word line WL while having the insulating layer OL interposed therebetween. The conductive layer 24 is patterned into the select gate lines SGD by forming the isolation layer SHE described below.

FIGS. 13Aa to 13Bc illustrate how the isolation layer SHE is formed. FIGS. 13Aa to 13Ac illustrate a cross section, which is a different cross section from those in FIGS. 12Aa, 12Ab, and the like, of the memory region MR, in the Y direction. Similarly to Ba to Bc of FIGS. 7Aa to 9Bc, FIGS. 13Ba to 13Bc illustrate the cross section, of the region including the stepped portion SP, in the Y direction, while showing processings corresponding to FIGS. 13Aa to 13Ac.

As illustrated in FIG. 13Aa, in the processing so far, the plurality of pillars PL is formed in the memory region MR at a predetermined period.

As illustrated in FIG. 13Ab, a groove TR penetrating through the insulating layer 52 and the conductive layers 24 corresponding to upper layers in the stacked body LM and extending substantially in the X direction in the stacked body LM is formed. Here, since the semiconductor memory device 1 of the embodiment includes the two select gate lines SGD0 and SGD1, the groove TR penetrates through the conductive layers 24 corresponding to the uppermost layer and the second uppermost layer and reaches the insulating layer OL immediately below the second uppermost conductive layer 24.

In addition, in the example illustrated in FIG. 13Ab, the groove TR is formed immediately above one pillar PL among the plurality of pillars PL arranged at a predetermined period. This is because the pillars PL may be arranged also at positions where the isolation layer SHE is formed such that the period at which the pillar PL are arranged is maintained when forming the plurality of pillars PL.

In this case, a part or all of the upper structure of the pillar PL disappears by the groove TR, and an effective memory cell MC is not formed in such a pillar PL. Therefore, the pillar PL in which the groove TR is formed becomes a dummy pillar PLd that does not contribute to the function of the semiconductor memory device 1.

As illustrated in FIG. 13Ac, the groove TR is filled with an insulating layer such as a silicon oxide layer. As a result, the isolation layer SHE is formed, so that the conductive layers 24 above the word line WL are patterned into the select gate lines SGD0 and SGD1.

FIG. 13Ba illustrates the vicinity of the center of the stepped portion SP away from the stepped portion SPs in the Y direction.

As illustrated in FIG. 13Bb, in parallel with the processing of FIG. 13Ab in the memory region MR, a groove TR penetrating through the insulating layers 52 and 51 and the conductive layer 24 corresponding to the second uppermost layer of the stacked body LM and extending substantially in the X direction in the stacked body LM is formed in the stepped portion SP.

As illustrated in FIG. 13Bc, in parallel with the processing of FIG. 13Ac in the memory region MR, the groove TR of the stepped portion SP is also filled with an insulating layer. As a result, the isolation layer SHE is formed also in the stepped portion SP, so that the conductive layer 24 above the word line WL is patterned into the select gate line SGD1.

Thereafter, the contacts CC are formed in the stepped region SR. That is, a plurality of contact holes penetrating through the insulating layers 52 and 51 and reaching each of the word lines WL and the select gate lines SGD and SGS constituting the respective steps of the stepped portion SP and the select gate lines SGD of the stepped portion SPf are collectively formed, and the insulating layer 56 and the conductive layer 22 (see FIG. 2A) are formed in the contact holes.

In addition, after the contacts CC are formed in the stepped portions SP and SPf or before the contacts CC are formed, the through contact C4 is formed in the through contact region TP. That is, the sacrificial layer 23s in the contact hole C4s and the insulating layer 57 on the bottom surface of the contact hole C4s are removed, and the conductive layer 23 (see FIG. 2B) fills the inner side of the insulating layer 57 on the side wall of the contact hole C4s. As a result, the through contact C4 connected to the peripheral circuit CUA via the lower layer wiring D2 in the insulating layer 50 is formed.

In addition, the insulating layer 55 is formed on the side walls of the slit ST at a timing before forming the through contact C4 or at the time of forming the through contact C4, and the inner side of the insulating layer 55 is filled with the conductive layer 21 to form the plate contact LI to be the source line contact. However, the insulating layer 55 and the like may fill the slit ST without forming the conductive layer 21, and a plate member not having a function as the source line contact may be formed.

In addition, the insulating layer 53 is formed on the insulating layer 52, and the plug V0 penetrating through the insulating layer 53 and connected to each of the plate contact LI, the through contact C4, and the contact CC is formed. In addition, the plug CH penetrating through the insulating layers 53 and 52 and connected to the pillar PL is formed. Furthermore, the insulating layer 54 is formed on the insulating layer 53, and the upper layer wiring MX, the bit line BL, and the like connected to the plugs V0 and CH, respectively, are formed.

For example, the plugs V0 and CH, the upper layer wiring MX, the bit line BL, and the like may be collectively formed by using a dual damascene method or the like.

The semiconductor memory device 1 of the embodiment is manufactured as described above.

In a process of manufacturing a semiconductor memory device such as a three-dimensional nonvolatile memory, a stacked body in which conductive layers and insulating layers are stacked may be formed by replacing sacrificial layers in the stacked body with the conductive layers. In this case, in order to support the fragile stacked body including a plurality of gap layers during replacement, for example, columnar portions may be arranged in a region other than a memory region. The columnar portion has, for example, a structure in which an insulating layer such as a silicon oxide layer fills a hole penetrating through the stacked body.

However, in a case where the columnar portion is formed of an insulating layer or the like, the insulating layer included in the columnar portion may shrink due to thermal treatment in a subsequent manufacturing process. In addition, due to the shrinkage of the plurality of columnar portions, the entire region where these columnar portions are arranged may sink in a stacking direction of the stacked body as compared with other regions such as the memory region. That is, the upper surface of the semiconductor memory device in the middle of manufacturing has unevenness.

When such sinking occurs, for example, the sinking region is not focused and proper exposure is not performed in some cases in processing using a lithography technology or the like. In addition, for example, in processing of polishing to remove a metal material filling a hole, a groove, or the like from the upper surface of the stacked body, a polishing residue of the metal material may be generated in a region where the sinking has occurred.

Therefore, for example, it is conceivable to form the columnar portion with a harder material having a higher Young's modulus than a silicon oxide layer or the like. In this case, for example, if the columnar portion has the same layer structure as that of a pillar including a channel layer or the like having a high Young's modulus, the columnar portion and the pillar can be collectively formed, which is convenient.

However, in a case where the columnar portion has the same layer structure as that of the pillar, another issue described below may occur.

That is, for a charge accumulation layer of the pillar, the same kind of material as the sacrificial layer to be replaced when forming the stacked body including the plurality of conductive layers may be used. In a case where a nitride layer or the like corresponding to the charge accumulation layer is included in the columnar portion, there is a possibility that a slit and the columnar portion come into contact with each other and the nitride layer of the columnar portion is exposed in the slit when forming the slit for performing replacement in the stacked body. In this case, when the replacement processing is performed through the slit, even the nitride layer of the columnar portion is replaced with the conductive layer via the exposed portion, as a result of which a withstand voltage may be insufficient between a plurality of word lines.

According to the semiconductor memory device 1 of the embodiment, the columnar portion HRc extending in the stacking direction at the position overlapping the stepped portion SP in the stacking direction of the stacked body LM in the stepped region SR, including the insulating layer 59, and having a layer structure different from that of the pillar PL; and the columnar portion HRm extending in the stacking direction in the stacked body LM in the through contact region TP and having the same layer structure as that of the pillar PL are included.

As described above, the tapered shape or bowing shape of the plate contact LI is more remarkable in the insulating layer 51 covering the stepped region SR than in the stacked body LM. For this reason, the columnar portion HRc, which includes only the insulating layer 59, is disposed in the stepped region SR in which the width of the plate contact LI is remarkably widened and the risk of contact with the plate contact LI is higher, so that the contact with the plate contact LI can be allowed.

On the other hand, in the through contact region TP having the stacked structure of the word line WL and the insulating layer OL or the insulating layer NL and the insulating layer OL, the increase in width of the plate contact LI is suppressed, and the risk of contact with the plate contact LI is low. Therefore, the columnar portion HRm having the same layer structure as the pillar PL is disposed in the through contact region TP so that sinking of the stacked body LM can be suppressed while avoiding the contact with the plate contact LI.

According to the semiconductor memory device 1 of the embodiment, the columnar portion HRm includes the dummy layer CRd extending in the stacked body LM in the stacking direction of the stacked body LM, the dummy layer CNd covering the side wall of the dummy layer CRd, and the dummy layer MEd covering the side wall of the dummy layer CNd.

Even in a semiconductor layer having a high Young's modulus, for example, when the volume of the semiconductor layer increases, agglomeration may occur by heat treatment. As the dummy layer CRd is disposed as the core material of the columnar portion HRm and is covered with the thin dummy layer CNd, it is possible to suppress agglomeration of the dummy layer CNd and to further suppress sinking of the stacked body LM.

According to the semiconductor memory device 1 of the embodiment, the isolation layer SHE separates one or more of the plurality of conductive layers into the sections of the plurality of select gate lines SGD, and the columnar portion HRm is further disposed at a position overlapping a portion where the select gate lines SGD0 and SGD1 penetrated by the isolation layer SHE are processed in a stepped shape.

As described above, the larger the extending distance in the stacking direction of the stacked body LM in the insulating layer 51, the more it is likely that the plate contact LI, the columnar portion HRm, or the like tends to have a more greatly tapered or bowing shape, and the contact risk between these components also increases.

Therefore, in the stepped portions SP and SPf, the columnar portion HRm is disposed in the stepped part formed by the select gate line SGD having a low contact risk between the components, and the columnar portion HRc is disposed in a stepped part of the lower layers of the word lines WL having a high contact risk between the components. As a result, the sinking of the stacked body LM can be further suppressed while avoiding the contact between the plate contact LI and the columnar portion HRm.

According to the semiconductor memory device 1 of the embodiment, the stepped portion SP included in one block region BLK and the insulating portion NR included in a block region BLK adjacent to the block region BLK in the Y direction are arranged side by side in the Y direction while having the plate contact LI interposed therebetween.

As a result, the through contact region TP sandwiches the stepped region SR in which the columnar portion HRc is disposed in the stepped part of the lower layers of the word lines WL or the like from opposite sides in the Y direction. As a result, the stepped region SR can also be supported by the columnar portion HRm of the through contact region TP, so that sinking in the stepped region SR can be further suppressed.

First and Second Modified Examples

In the above-described embodiment, the columnar portions HRm and HRc are disposed together in the stepped region SR. The arrangement of the columnar portions HRm and HRc in the stepped region SR can be appropriately adjusted.

For example, in a case where the risk of contact between the plate contact LI and the columnar portion HRm is not very high due to the arrangement density of the columnar portions HRm and HRc, the hardness of the insulating layer 51, or the like, or in a case where the sinking of the stacked body LM is more remarkable, the region where the columnar portions HRm are arranged in the stepped region SR can be increased.

On the other hand, for example, in a case where the risk of contact with the plate contact LI is high, or in a case where the sinking of the stacked body Lm is not so remarkable, the region where the columnar portion HRc are arranged in the stepped region SR can be increased.

Next, semiconductor memory devices 2 and 3 according to first and second modified examples of the embodiment will be described with reference to FIGS. 14A to 17. In the semiconductor memory devices 2 and 3 of the first and second modified examples, arrangement of columnar portions HRm and HRc in stepped regions SR2 and SR3 is different from that of the above-described embodiment. Hereinafter, the same reference signs are given to the same components as those of the above-described embodiment, and a description thereof may be omitted.

Figure 14A:
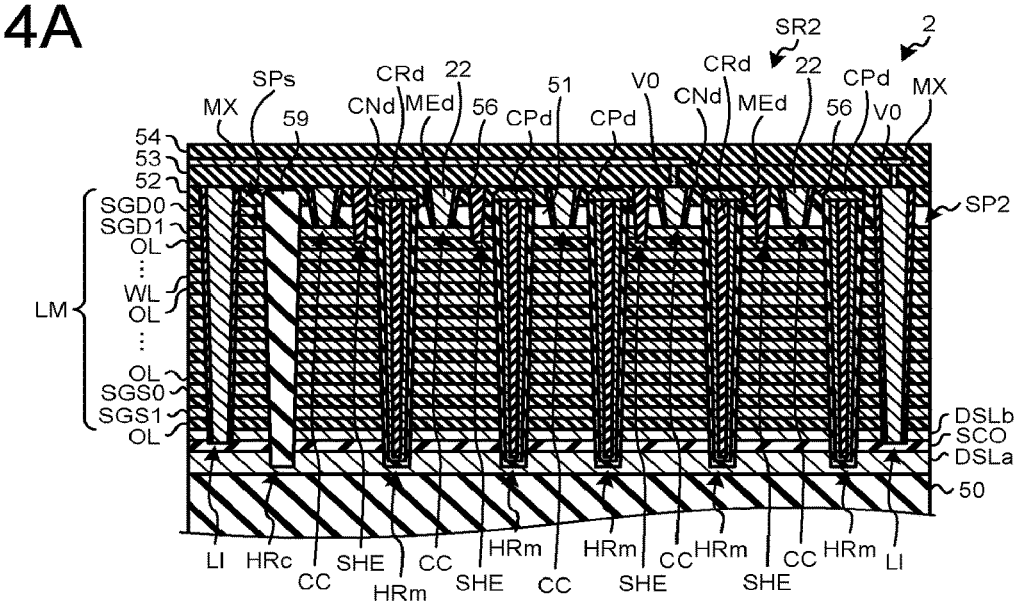
FIGS. 14A to 14C are cross-sectional views, including a stepped portion with different layers in a semiconductor memory device according to a first modified example of the embodiment, in the Y direction.
Figure 14B:
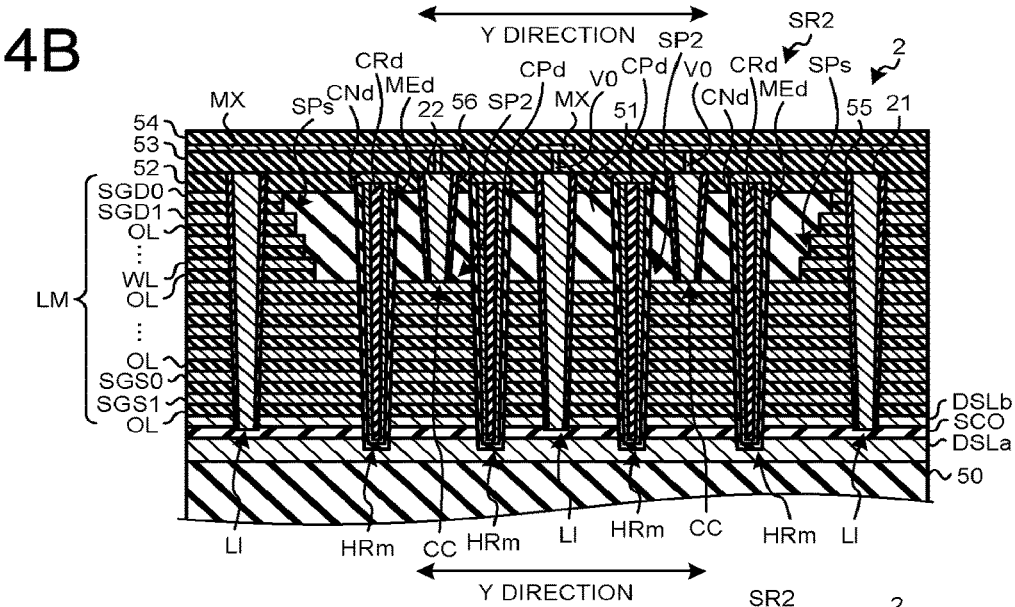
Figure 14C:
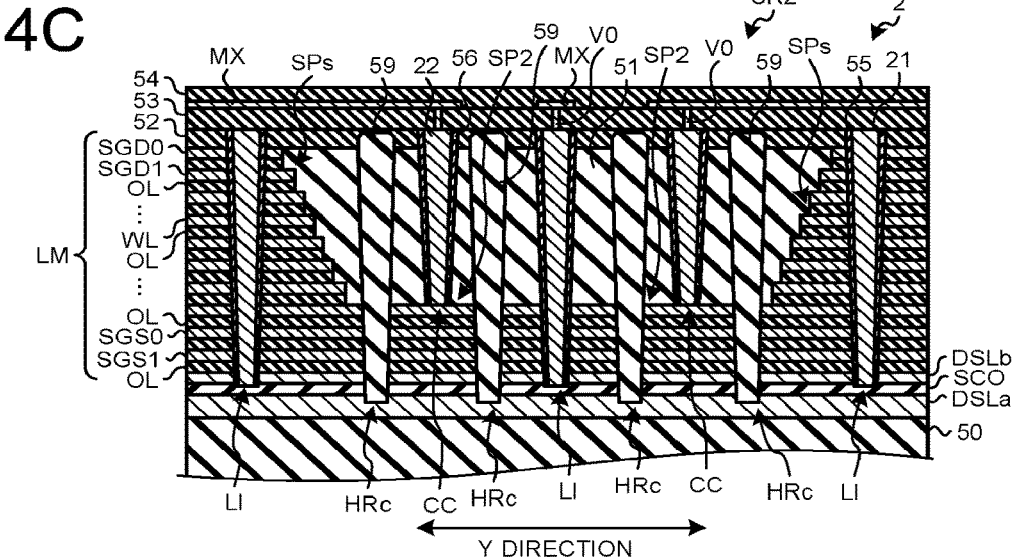

FIGS. 14A to 14C are cross-sectional views, including a stepped portion SP2 with different layers in the semiconductor memory device 2 according to the first modified example of the embodiment, in the Y direction.

FIG. 14A illustrates a cross section in which a select gate line SGD1 constitutes a terrace surface. That is, FIG. 14A corresponds to FIG. 3A of the above-described embodiment and illustrates the stepped portion SP2 of the layers of select gate lines SGD0 and SGD1 which are an example of a configuration of the upper layers of a stacked body LM.

As illustrated in FIG. 14A, a plurality of columnar portions HRm is disposed in a region where the select gate line SGD1 constitutes the terrace surface in the stepped region SR2. As described above, in the semiconductor memory device 2 of the first modified example, as in the above-described embodiment, the columnar portion HRm is disposed in a region where the layers of the select gate lines SGD0 and SGD1 are processed in a stepped shape in the stepped portion SP2 of a stepped region SR2. The same applies to a stepped portion facing the stepped portion SP2 in the X direction and corresponding to the above-described stepped portion SPf.

FIG. 14B illustrates a cross section in which the fourth word line WL from the lowermost word line WL of the stacked body LM constitutes the terrace surface. That is, FIG. 14B corresponds to FIG. 3B of the above-described embodiment, and illustrates an example of a configuration of the upper layers of the stepped portion SP2 among of a plurality of word lines WL.

As illustrated in FIG. 14B, the plurality of columnar portions HRm is arranged in a region where the word line WL on the upper layer side constitutes the terrace surface in the stepped region SR2. As described above, in the semiconductor memory device 2 of the first modified example, unlike the above-described embodiment, the columnar portion HRm is also disposed in a region where the word line WL on the upper layer side is processed in the stepped shape in the stepped portion SP2. The same applies to a stepped portion corresponding to the above-described stepped portion SPf.

FIG. 14C illustrates a cross section in which the lowermost word line WL of the stacked body LM constitutes the terrace surface. That is, FIG. 14C corresponds to FIG. 3C of the above-described embodiment, and illustrates an example of a configuration of the layers of the select gate lines SGS0 and SGS1 and the lower word lines WL among of the plurality of word lines WL in the stepped portion SP2.

As illustrated in FIG. 14C, a plurality of columnar portions HRc is arranged in a region where the word line WL on the lower layer side constitutes the terrace surface in the stepped region SR2. As described above, in the semiconductor memory device 2 of the first modified example, as in the above-described embodiment, the columnar portion HRc is disposed in a region where the layers of the word line WL and the select gate lines SGS0 and SGS1 on the lower layer side are processed in a stepped shape in the stepped portion SP2. The same applies to a stepped portion corresponding to the above-described stepped portion SPf.

Figure 15:
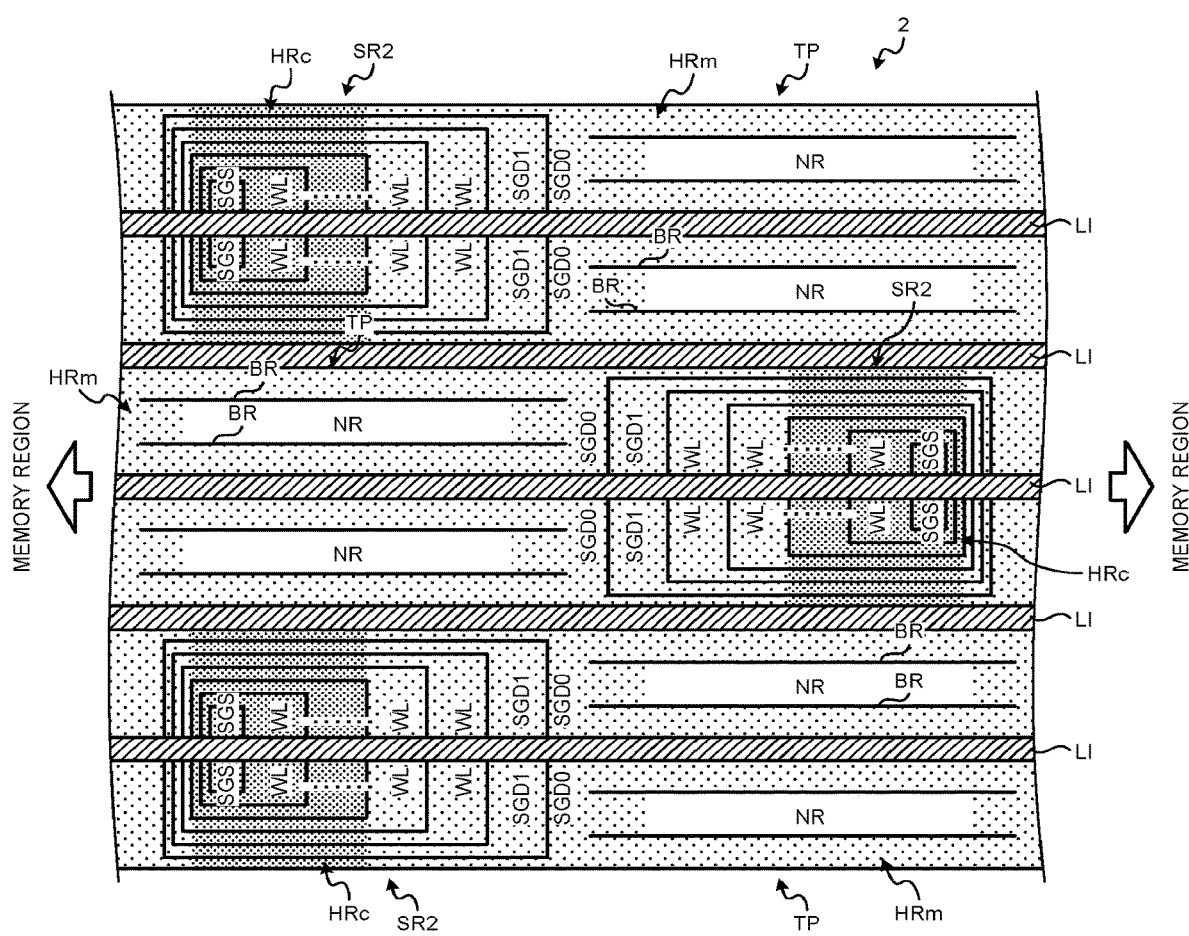
FIG. 15 is a schematic plan view illustrating arrangement of columnar portions in a stepped region and a through contact region of the semiconductor memory device according to the first modified example of the embodiment.

FIG. 15 is a schematic plan view illustrating arrangement of the columnar portions HRm and HRc in the stepped region SR2 and a through contact region TP of the semiconductor memory device 2 according to the first modified example of the embodiment. That is, FIG. 15 corresponds to FIG. 4A of the above-described embodiment.

As illustrated in FIG. 15, in the stepped region SR2 and the through contact region TP of the semiconductor memory device 2, the plurality of columnar portions HRc is disposed in a portion where the lower layers of the plurality of word lines WL and the select gate lines SGS0 and SGS1 have a stepped shape in the stepped portion SP2 in the stepped region SR2 and the stepped portion facing the stepped portion SP2 in the X direction, while avoiding interference with plate contacts LI and contacts CC.

In the stepped region SR2 and the through contact region TP of the semiconductor memory device 2, the columnar portions HRm are disposed in a region of the stacked body LM other than the above. That is, the columnar portions HRm are disposed in a region in the X direction corresponding to a portion where the select gate lines SGD0 and SGD1 and the upper layer sides of the plurality of word lines WL are processed in a stepped shape in the stepped portion SP2 and the stepped portion facing the stepped portion SP2 in the X direction, and a region excluding an insulating portion NR of the through contact region TP, while avoiding interference with the plate contacts LI and the contacts CC.

Note that the plurality of columnar portions HRm and HRc may also be dispersedly arranged in dummy stepped portions at opposite end portions of the stacked body LM in the X direction and the Y direction. In this case, the columnar portions HRm may be disposed in a portion where the select gate lines SGD0 and SGD1 of the stacked body LM and the upper layer sides of the plurality of word lines WL constitute the terrace surfaces in the dummy stepped portion. Furthermore, in the dummy stepped portion, the columnar portions HRc may be disposed in a portion where the lower layers of the plurality of word lines WL and the select gate lines SGS0 and SGS1 of the stacked body LM constitute the terrace surfaces.

According to the semiconductor memory device 2 of the first modified example, the columnar portion HRm is also disposed at a position overlapping a portion where one or more word lines WL continuous to the select gate line SGD1 in the stacking direction of the stacked body LM among the plurality of word lines WL are processed in a stepped shape. As a result, the sinking of the stacked body LM in the stepped region SR2 can be further suppressed.

The division between the upper layer side and the lower layer side of the plurality of word lines WL can be appropriately determined according to the level of the contact risk between the plate contact LI and the columnar portion HRm, the degree of sinking of the stacked body LM, or the like.

Figure 16A:
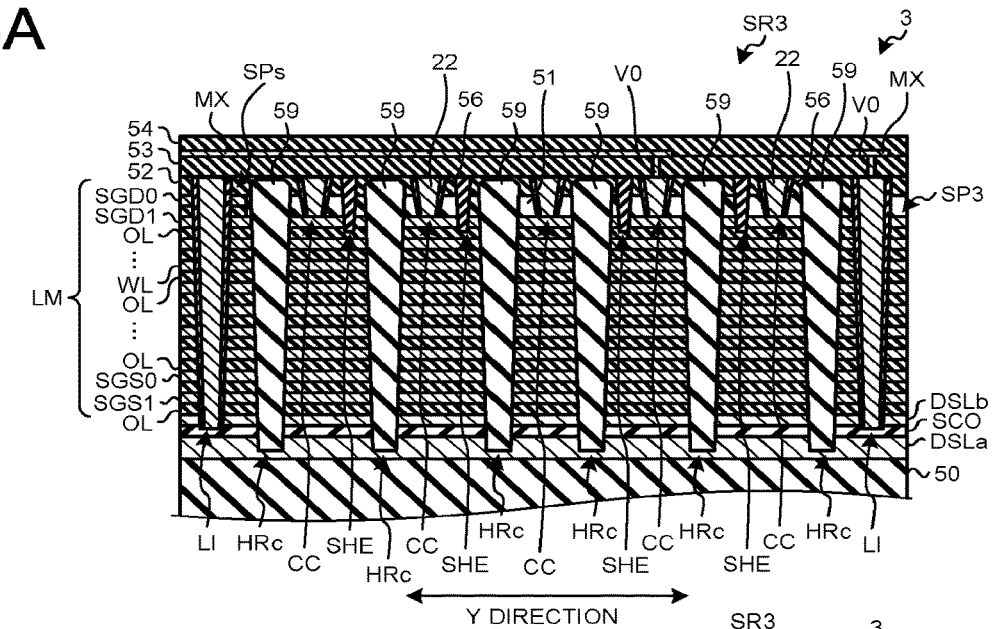
FIGS. 16A to 16C are cross-sectional views, including a stepped portion with different layers in a semiconductor memory device according to a second modified example of the embodiment, in the Y direction.
Figure 16B:
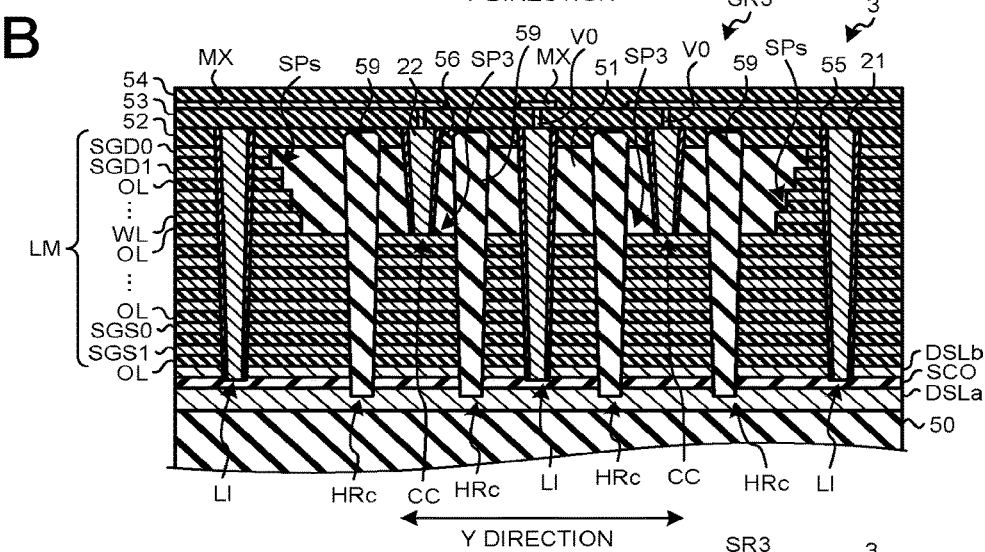
Figure 16C:
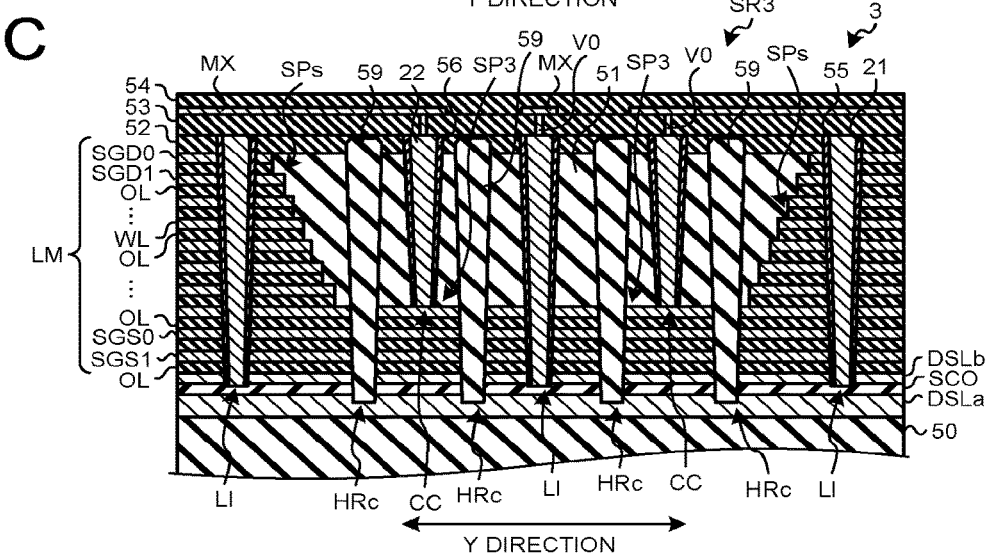

FIGS. 16A to 16C are cross-sectional views, including a stepped portion SP3 with different layers in the semiconductor memory device 3 according to the second modified example of the embodiment, in the Y direction.

FIG. 16A illustrates a cross section in which a select gate line SGD1 constitutes a terrace surface. That is, FIG. 16A corresponds to FIG. 3A of the above-described embodiment and illustrates the stepped portion SP3 of the layers of select gate lines SGD0 and SGD1 which are an example of a configuration of the upper layers of a stacked body LM.

As illustrated in FIG. 16A, a plurality of columnar portions HRc is disposed in a region where the select gate line SGD1 constitutes the terrace surface in a stepped region SR3. As described above, in the semiconductor memory device 3 of the second modified example, unlike the above-described embodiment, the columnar portion HRc is disposed in a region where the layers of the select gate lines SGD0 and SGD1 are processed in a stepped shape in the stepped region SR3.

FIG. 16B illustrates a cross section in which the fourth word line WL from the lowermost word line WL of the stacked body LM constitutes the terrace surface. That is, FIG. 16B corresponds to FIG. 3B of the above-described embodiment, and illustrates an example of a configuration of the upper layers of the stepped portion SP3 among of a plurality of word lines WL.

As illustrated in FIG. 16B, the plurality of columnar portions HRc is arranged in a region where the word line WL on the upper layer side constitutes the terrace surface in the stepped region SR3. As described above, in the semiconductor memory device 3 of the second modified example, as in the above-described embodiment, the columnar portion HRc is also disposed in a region where the word line WL on the upper layer side is processed in the stepped shape in the stepped region SR3.

FIG. 16C illustrates a cross section in which the lowermost word line WL of the stacked body LM constitutes the terrace surface. That is, FIG. 16C corresponds to FIG. 3C of the above-described embodiment, and illustrates an example of a configuration of the layers of the select gate lines SGS0 and SGS1 and the lower word lines WL among of the plurality of word lines WL in the stepped portion SP3.

As illustrated in FIG. 16C, a plurality of columnar portions HRc is arranged in a region where the word line WL on the lower layer side constitutes the terrace surface in the stepped region SR3. As described above, in the semiconductor memory device 3 of the second modified example, as in the above-described embodiment, the columnar portion HRc is also disposed in a region where the word line WL and the select gate lines SGS0 and SGS1 on the lower layer side are processed in a stepped shape in the stepped region SR3.

Figure 17:
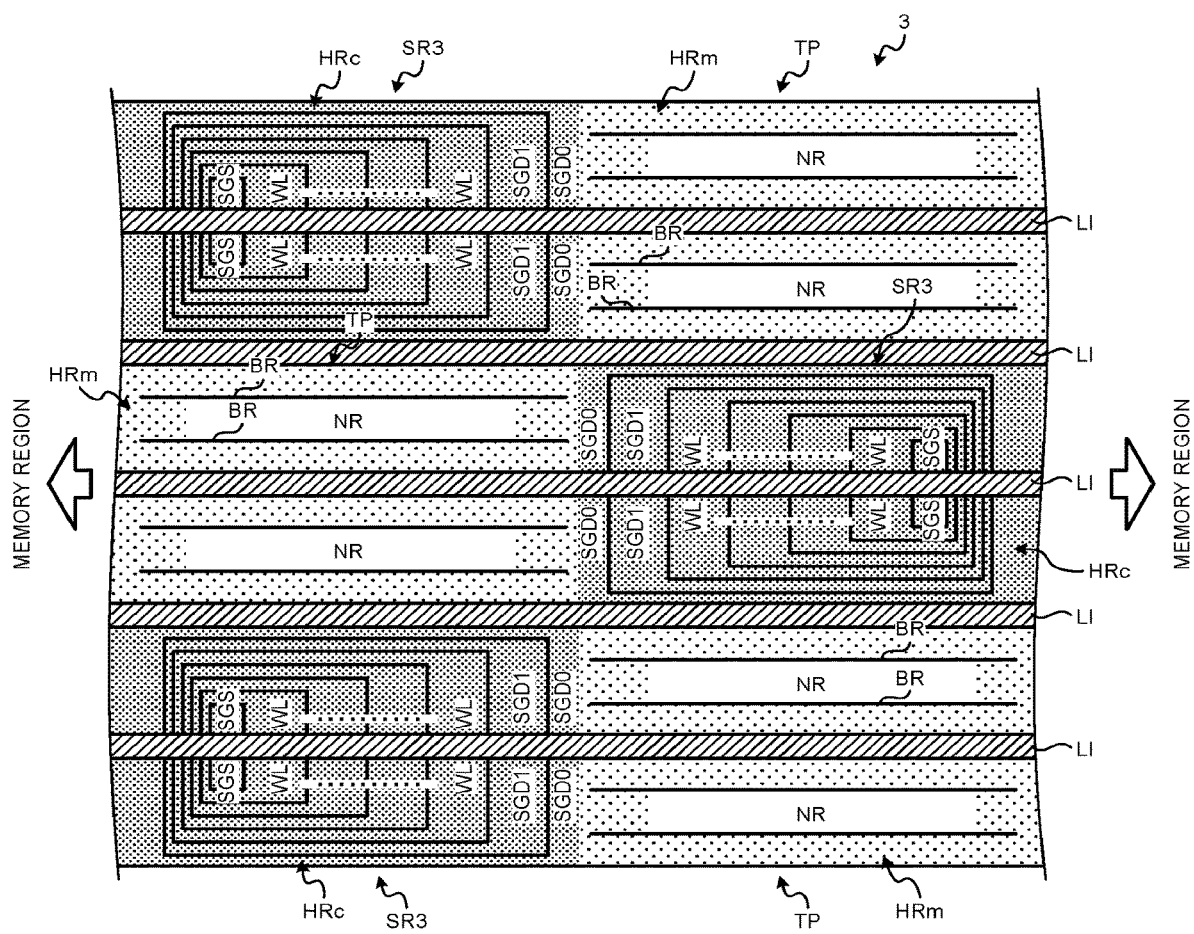
FIG. 17 is a schematic plan view illustrating arrangement of columnar portions in a stepped region and a through contact region of the semiconductor memory device according to the second modified example of the embodiment.

FIG. 17 is a schematic plan view illustrating arrangement of the columnar portions HRm and HRc in the stepped region SR3 and a through contact region TP of the semiconductor memory device 3 according to the second modified example of the embodiment. That is, FIG. 17 corresponds to FIG. 4A of the above-described embodiment.

As illustrated in FIG. 17, in the stepped region SR3 where the plurality of word lines WL and the select gate lines SGD and SGS have a stepped shape among the stepped region SR3 and the through contact region TP of the semiconductor memory device 3, the plurality of columnar portions HRc is disposed while avoiding interference with plate contacts LI and contacts CC.

In the stepped region SR3 and the through contact region TP of the semiconductor memory device 3, the columnar portions HRm are disposed in a region of the stacked body LM other than the above. That is, the columnar portion HRm is not disposed in the stepped region SR3, and is disposed in a region of the through contact region TP excluding an insulating portion NR while avoiding interference with the plate contacts LI.

Note that the plurality of columnar portions HRc may also be dispersedly arranged in dummy stepped portions at opposite end portions of the stacked body LM in the X direction and the Y direction.

According to the semiconductor memory device 3 of the second modified example, the plurality of columnar portions HRc is dispersedly arranged over the entire stepped region SR3. As a result, the sinking of the stacked body LM can be suppressed while allowing the contact between the plate contact LI and the columnar portion HRc in the entire stepped region SR3.

Third Modified Example

Figure 18:
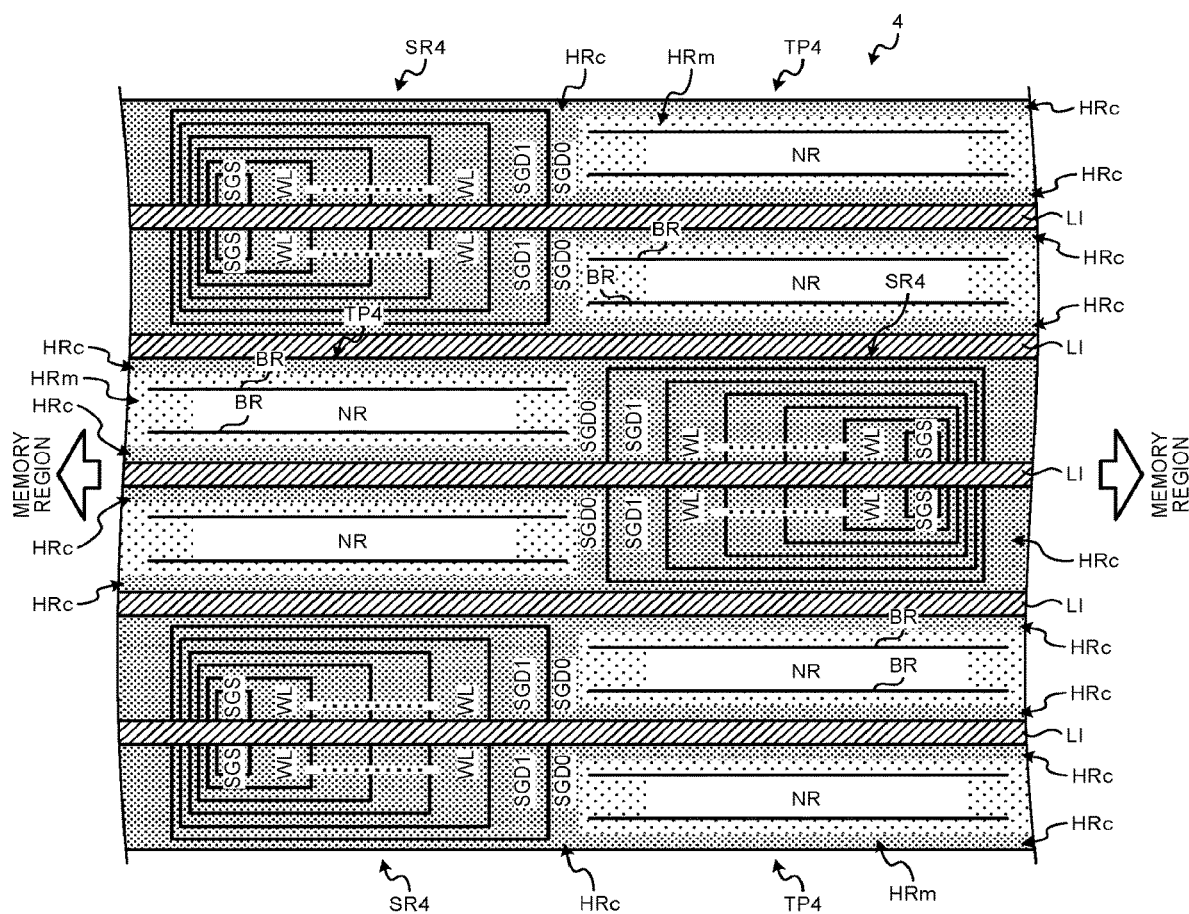
FIG. 18 is a schematic plan view illustrating arrangement of columnar portions in a stepped region and a through contact region of a semiconductor memory device according to a third modified example of the embodiment.

In the configurations of the above-described embodiment or the first and second modified examples, regardless of the stepped regions SR, SR2, and SR3 or the through contact region TP, the columnar portion HRc may be disposed in a region close to the plate contact LI. FIG. 18 illustrates an example in which columnar portions HRc are further arranged in the vicinity of a plate contact LI based on the arrangement of the columnar portions HRm and HRc in the second modified example.

FIG. 18 is a schematic plan view illustrating arrangement of columnar portions HRm and HRc in a stepped region SR4 and a through contact region TP4 of a semiconductor memory device 4 according to a third modified example of the embodiment. That is, FIG. 18 corresponds to FIG. 4A of the above-described embodiment. Hereinafter, the same reference signs are given to the same components as those of the above-described embodiment, and a description thereof may be omitted.

As illustrated in FIG. 18, in the semiconductor memory device 4, the columnar portions HRc are disposed at positions close to the plate contact LI over the entire region of the stepped region SR4 and the through contact region TP4 in the X direction. In other words, among the columnar portions HRm and HRc dispersedly arranged in the stepped region SR4 and the through contact region TP4, one or more rows of columnar portions HRc are arranged adjacent to the plate contact LI.

In the semiconductor memory device 4 according to the third modified example, the risk of contact with the plate contact LI can be further reduced.

OTHER MODIFIED EXAMPLES

In the above-described embodiment and first to third modified examples, the stepped portions SP, SP2, and SP3, and the like are disposed in the central portion of the stacked body LM while being sandwiched by the memory regions MR. However, for example, the contact CC may be disposed in a stepped portion on one side or opposite sides in the X direction of the stacked body LM to have a function of drawing the word line WL or the like. Also in this case, the configurations of the columnar portions HRm and HRc and the like of the above-described embodiment and first to third modified examples can be applied.

According to the above-described embodiment and first to third modified examples, the pillar PL is connected to the source line SL on the side surface of the channel layer CN, but is not limited thereto. For example, the pillar may be connected to the source line at the lower end portion of the channel layer by removing the memory layer on the bottom surface of the pillar.

In addition, in the above-described embodiment and first to third modified examples, the insulating layers NL and OL are alternately stacked to form the stacked body LMs. However, the stacked body LMs may be formed in a plurality of tiers, and in this case, the pillars PL, the columnar portions HRm and HRc, the stepped portions SP, SP2, and SP3, and the like may be formed in stages every time the stacked body LMs for one tier is formed. As a result, the number of stacked word lines WL can be further increased.

In the above-described embodiment and first to third modified examples, the peripheral circuit CUA is disposed below the stacked body LM. However, the peripheral circuit CUA may be disposed above the stacked body LM or in the same hierarchy as the stacked body LM.

In a case where the peripheral circuit CUA is disposed above the stacked body LM, for example, the peripheral circuit CUA may be formed on a semiconductor substrate different from the substrate on which the stacked body LM is formed, and the semiconductor substrate on which the peripheral circuit CUA is formed may be bonded to the upper surface of the stacked body LM. With this configuration, the stacked body LM can also be formed on a substrate other than the semiconductor substrate. In this case, after a polysilicon layer or the like is formed as the source line on the substrate, the stacked body LM can be formed over the source line.

In a case where the peripheral circuit CUA is disposed in the same hierarchy as the stacked body LM, the stacked body LM can be formed at a position different from the peripheral circuit CUA over the semiconductor substrate on which the peripheral circuit CUA is formed. With this configuration, the stacked body LM can be formed over the semiconductor substrate by diffusing impurities into the surface layer of the semiconductor substrate and using a part of the semiconductor substrate as the source line. In this case, the semiconductor memory device does not have to include the through contact region TP.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a first stacked body that includes a plurality of conductive layers and a plurality of first insulating layers alternately stacked one by one and includes a memory region, a stepped region, and a connection region arranged in a first direction intersecting a stacking direction of the plurality of conductive layers;
    a contact portion that is disposed in the connection region and electrically connects structures disposed above and below the first stacked body to each other;
    a plurality of first pillars that is disposed in the memory region, extends in the first stacked body in the stacking direction, and forms a memory cell at each intersection with at least a part of the plurality of conductive layers;

a plurality of second pillars that includes a second insulating layer, has a layer structure different from a layer structure of the first pillars, and extends in the stacking direction in a position overlapping a stepped portion disposed in the stepped region, in the stacking direction, the plurality of conductive layers being processed in a stepped shape in the stepped portion; and a plurality of third pillars that extends in the first stacked body in the stacking direction and has a same layer structure as the layer structure of the first pillars, at least a part of the plurality of third pillars being disposed in the connection region.

2. The semiconductor memory device according to claim 1, wherein each of the plurality of second pillars has a single layer structure of the second insulating layer, and each of the plurality of third pillars includes a core material of an insulator extending in the stacking direction, a semiconductor layer covering a side wall of the core material, and a third insulating layer covering a side wall of the semiconductor layer and containing a different kind of material from that of the second insulating layer.

3. The semiconductor memory device according to claim 2, wherein the second insulating layer is an oxide layer, and the third insulating layer includes an oxide layer and a nitride layer.

4. The semiconductor memory device according to claim 1, wherein the plurality of second pillars is disposed, in the position overlapping the stepped portion, to overlap a portion where lower conductive layers of the first stacked body among the plurality of conductive layers are processed in the stepped shape, a first part of the plurality of third pillars corresponding to the at least part of the plurality of third pillars is disposed in the connection region, and a second part of the plurality of third pillars is disposed, in the position overlapping the stepped portion, to overlap a portion where upper conductive layers of the first stacked body among the plurality of conductive layers are processed in the stepped shape, and extends in the stacking direction.

5. The semiconductor memory device according to claim 4, further comprising an isolation layer that penetrates through an uppermost conductive layer among the plurality of conductive layers or penetrates through the uppermost conductive layer and one or more conductive layers continuous to the uppermost conductive layer among the plurality of conductive layers in the stacking direction and selectively isolates one or more upper conductive layers among the plurality of conductive layers in a second direction intersecting the stacking direction and the first direction, wherein the second part of the plurality of third pillars is disposed to overlap a portion where the one or more upper conductive layers penetrated by the isolation layer are processed in the stepped shape.

6. The semiconductor memory device according to claim 5, wherein a third part of the plurality of third pillars is disposed, in the position overlapping the stepped portion, to overlap a portion where one or more conductive layers that are positioned below the one or more upper conductive layers and are continuous to a lowermost conductive layer of the one or more upper conductive layers in the stacking direction among the plurality of conductive layers are processed in the stepped shape, and extends in the stacking direction.

7. The semiconductor memory device according to claim 4, wherein the contact portion includes a second stacked body that includes a plurality of fourth insulating layers and the plurality of first insulating layers alternately stacked one by one, and is surrounded by the first stacked body in which the third pillars are dispersedly arranged when viewed from the stacking direction.

8. The semiconductor memory device according to claim 7, wherein the contact portion further includes a plurality of through contacts that extends in the second stacked body in the stacking direction and electrically connects the structures disposed above and below the first stacked body, and none of the second and third pillars is disposed between the through contacts.

9. The semiconductor memory device according to claim 1, wherein the plurality of second pillars is dispersedly arranged over the entire stepped region.

10. The semiconductor memory device according to claim 1, further comprising a plate member that extends in the first stacked body in the stacking direction and the first direction and divides the first stacked body in a second direction intersecting the stacking direction and the first direction, wherein the stepped portion includes a first stepped portion disposed on one side of the plate member in the second direction, and a second stepped portion disposed on the other side of the plate member in the second direction, the contact portion includes a first contact portion disposed on the one side of the plate member in the second direction, and a second contact portion disposed on the other side of the plate member in the second direction, the first stepped portion and the second contact portion are arranged side by side in the second direction with the plate member interposed therebetween, and the second stepped portion and the first contact portion are arranged side by side in the second direction with the plate member interposed therebetween.

11. The semiconductor memory device according to claim 10, wherein the stepped region includes a first stepped region including the first stepped portion and covered with a fifth insulating layer at least up to a height position corresponding to an uppermost layer of the first stacked body, and a second stepped region including the second stepped portion and covered with the fifth insulating layer at least up to a height position corresponding to the uppermost layer of the first stacked body, and the plate member includes a first plate member extending in the first direction at a position between the first and second stepped portions, and a second plate member extending in the first direction at a position that is opposite to the first plate member in the second direction with respect to the first stepped portion and overlaps the first stepped region, and dividing the fifth insulating layer in the second direction.

12. A semiconductor memory device comprising:
a first stacked body that includes a plurality of conductive layers and a plurality of first insulating layers alternately stacked one by one and includes a stepped portion in which the plurality of conductive layers is processed in a stepped shape;
a plurality of first pillars that extends in a stacking direction of the first stacked body in the first stacked body in a position away from the stepped portion in a first direction intersecting the stacking direction and forms a memory cell at each intersection with at least a part of the plurality of conductive layers;
a plurality of second pillars that includes a second insulating layer, has a layer structure different from a layer structure of the first pillars, and extends in the stacking direction in a position overlapping a portion where lower conductive layers of the first stacked body among the plurality of conductive layers are processed in the stepped shape; and
a plurality of third pillars that extends in the first stacked body in the stacking direction and has the same layer structure as the layer structure of the first pillars, at least a part of the plurality of third pillars being disposed in a position overlapping a portion where upper conductive layers of the first stacked body among the plurality of conductive layers are processed in the stepped shape.

13. The semiconductor memory device according to claim 12, wherein
each of the plurality of second pillars has a single layer structure of the second insulating layer, and
each of the plurality of third pillars includes
a core material of an insulator extending in the stacking direction,
a semiconductor layer covering a side wall of the core material, and
a third insulating layer covering a side wall of the semiconductor layer and containing a different kind of material from that of the second insulating layer.

14. The semiconductor memory device according to claim 13, wherein
the second insulating layer is an oxide layer, and
the third insulating layer includes an oxide layer and a nitride layer.

15. The semiconductor memory device according to claim 12, further comprising
an isolation layer that penetrates through an uppermost conductive layer among the plurality of conductive layers or penetrates through the uppermost conductive layer and one or more conductive layers continuous to the uppermost conductive layer among the plurality of conductive layers in the stacking direction and selectively isolates one or more upper conductive layers among the plurality of conductive layers in a second direction intersecting the stacking direction and the first direction, wherein
at least a part of the plurality of third pillars is disposed to overlap a portion where the one or more upper conductive layers penetrated by the isolation layer are processed in the stepped shape, and extends in the stacking direction.

16. The semiconductor memory device according to claim 15, wherein
at least another part of the plurality of third pillars is disposed to overlap a portion where one or more conductive layers that are positioned below the one or more upper conductive layers and are continuous to a lowermost conductive layer of the one or more upper conductive layers in the stacking direction among the plurality of conductive layers are processed in the stepped shape, and extends in the stacking direction.

17. The semiconductor memory device according to claim 12, further comprising
a second stacked body that includes a plurality of fourth insulating layers and the plurality of first insulating layers alternately stacked one by one and is surrounded by the first stacked body when viewed from the stacking direction, wherein
another part of the plurality of third pillar other than the at least part of the plurality of third pillars extends in the stacking direction in the first stacked body surrounding the second stacked body.

18. The semiconductor memory device according to claim 12, wherein
the plurality of second pillars is dispersedly arranged in the position overlapping the portion where the lower conductive layers are processed in the stepped shape, and
the plurality of third pillars is dispersedly arranged in the position overlapping the portion where the upper conductive layers are processed in the stepped shape.

19. The semiconductor memory device according to claim 18, further comprising
a fifth insulating layer that covers the stepped portion at least up to a height position corresponding to an uppermost layer of the first stacked body; and
a plate member that extends in the first stacked body in the stacking direction and the first direction and is in contact with the fifth insulating layer in a second direction intersecting the stacking direction and the first direction.

20. The semiconductor memory device according to claim 18, further comprising
a fifth insulating layer that covers the stepped portion at least up to a height position corresponding to an uppermost layer of the first stacked body; and
a plurality of contacts that penetrates through the fifth insulating layer and is connected to the plurality of conductive layers in the stepped portion.

* * * * *